United States Patent
Ando et al.

(10) Patent No.: US 11,240,450 B2
(45) Date of Patent: Feb. 1, 2022

(54) SOLID-STATE IMAGING ELEMENT, METHOD FOR MANUFACTURING SOLID-STATE IMAGING ELEMENT, AND ELECTRONIC APPARATUS

(71) Applicant: SONY SEMICONDUCTOR SOLUTIONS CORPORATION, Kanagawa (JP)

(72) Inventors: Yoshihiro Ando, Nagasaki (JP); Hideaki Togashi, Nagasaki (JP); Shinpei Fukuoka, Nagasaki (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/638,861

(22) PCT Filed: May 21, 2018

(86) PCT No.: PCT/JP2018/019519
§ 371 (c)(1),
(2) Date: Feb. 13, 2020

(87) PCT Pub. No.: WO2019/039010
PCT Pub. Date: Feb. 28, 2019

(65) Prior Publication Data
US 2021/0029317 A1    Jan. 28, 2021

(30) Foreign Application Priority Data

Aug. 22, 2017  (JP) .............................. JP2017-159376

(51) Int. Cl.
*H04N 5/369*  (2011.01)
*H04N 5/232*  (2006.01)
(Continued)

(52) U.S. Cl.
CPC ... *H04N 5/36961* (2018.08); *H01L 27/14621* (2013.01); *H01L 27/14647* (2013.01);
(Continued)

(58) Field of Classification Search
None
See application file for complete search history.

(56) References Cited

U.S. PATENT DOCUMENTS

| 10,453,898 B2 * | 10/2019 | Hirata ................... H01L 27/326 |
| 2011/0109776 A1 * | 5/2011 | Kawai ............... H01L 27/14627 348/273 |

(Continued)

FOREIGN PATENT DOCUMENTS

| CN | 105229791 A | 1/2016 |
| JP | 2015-050331 A | 3/2015 |

(Continued)

OTHER PUBLICATIONS

Title: Translation of WO2016104177A1 Author: Manda Shuji et al. Date: Jun. 30, 2016 (Year: 2016).*

(Continued)

*Primary Examiner* — Twyler L Haskins
*Assistant Examiner* — Wesley J Chiu
(74) *Attorney, Agent, or Firm* — Chip Law Group

(57) ABSTRACT

Provided is a solid-state imaging element including a plurality of pixels that includes at least two phase difference detection pixels for focus detection. Each pixel has a stacked structure including a plurality of photoelectric conversion elements that are stacked on top of each other and absorb light beams different in wavelength from one another to generate electrical charges, and each phase difference detection pixel includes, in the stacked structure, a color filter that (Continued)

partially covers an upper face of one of the photoelectric conversion elements and absorbs a light beam with a specific wavelength.

15 Claims, 22 Drawing Sheets

(51) Int. Cl.
  *H01L 27/146* (2006.01)
  *H04N 9/04* (2006.01)
(52) U.S. Cl.
  CPC . *H01L 27/14667* (2013.01); *H04N 5/232122* (2018.08); *H04N 9/0455* (2018.08); *H01L 27/14665* (2013.01)

(56) References Cited

U.S. PATENT DOCUMENTS

| | | | | |
|---|---|---|---|---|
| 2011/0216212 | A1* | 9/2011 | Watanabe | H04N 5/3575 348/222.1 |
| 2012/0033115 | A1* | 2/2012 | Fujii | H04N 5/3696 348/280 |
| 2013/0093911 | A1* | 4/2013 | Sul | H04N 5/3745 348/222.1 |
| 2014/0176771 | A1* | 6/2014 | Itou | H01L 27/14643 348/308 |
| 2015/0244951 | A1* | 8/2015 | Oishi | H01L 27/14603 348/243 |
| 2015/0270298 | A1* | 9/2015 | Lin | H01L 27/14621 257/432 |
| 2015/0325606 | A1* | 11/2015 | Togashi | H01L 27/14636 250/208.1 |
| 2015/0357364 | A1* | 12/2015 | Kim | H01L 27/14621 250/208.1 |
| 2016/0050359 | A1* | 2/2016 | Nakata | G03B 13/36 250/201.2 |
| 2016/0133865 | A1* | 5/2016 | Yamaguchi | H01L 51/4213 257/40 |
| 2016/0234428 | A1* | 8/2016 | Okazawa | H04N 5/36961 |
| 2016/0293873 | A1 | 10/2016 | Yamaguchi | |
| 2017/0243912 | A1* | 8/2017 | Kaneda | H01L 27/14647 |
| 2017/0358614 | A1* | 12/2017 | Azami | H01L 27/1461 |
| 2018/0374903 | A1* | 12/2018 | Otake | H04N 9/07 |
| 2020/0374475 | A1* | 11/2020 | Fukuoka | H01L 27/286 |

FOREIGN PATENT DOCUMENTS

| | | |
|---|---|---|
| KR | 10-2016-0051687 A | 5/2016 |
| WO | 2012/169301 A1 | 12/2012 |
| WO | 2015/029425 A1 | 3/2015 |
| WO | WO-2016104177 A1 * | 6/2016 ....... H01L 27/14603 |
| WO | 2016/117381 A1 | 7/2016 |
| WO | 2016/158439 A1 | 10/2016 |
| WO | 2016/194620 A1 | 12/2016 |
| WO | 2017/110515 A1 | 6/2017 |

OTHER PUBLICATIONS

International Search Report and Written Opinion of PCT Application No. PCT/JP2018/019519, dated Jun. 26, 2018, 10 pages of ISRWO.

Office Action for CN Patent Application No. 201880052831 X, dated Jul. 2, 2021, 09 pages of Office Action and 12 pages of English Translation.

* cited by examiner

SOLID-STATE IMAGING ELEMENT, METHOD FOR MANUFACTURING SOLID-STATE IMAGING ELEMENT, AND ELECTRONIC APPARATUS

CROSS REFERENCE TO RELATED APPLICATIONS

This application is a U.S. National Phase of International Patent Application No. PCT/JP2018/019519 filed on May 21, 2018, which claims priority benefit of Japanese Patent Application No. JP 2017-159376 filed in the Japan Patent Office on Aug. 22, 2017. Each of the above-referenced applications is hereby incorporated herein by reference in its entirety.

FIELD

The present disclosure relates to a solid-state imaging element, a method for manufacturing the solid-state imaging element, and an electronic apparatus.

BACKGROUND

A recent imaging device has employed, as an autofocus function, a method of detecting a phase difference, using a pair of phase difference detection pixels having asymmetric sensitivity with respect to incident angles of light beams. A solid-state imaging element disclosed in Patent Literature 1 listed below can be cited as such an example. In Patent Literature 1, specifically, the foregoing phase difference detection pixels are actualized by providing divided lower electrodes of pixels or providing light shielding films on the pixels.

CITATION LIST

Patent Literature

Patent Literature 1: JP 2015-50331 A

SUMMARY

Technical Problem

In the phase difference detection pixels disclosed in Patent Literature 1, unnecessary electrical charges are generated; therefore, it is occasionally necessary to provide a mechanism (such as a plug) for discharging the unnecessary electrical charges. As a result, the mechanism for discharging the unnecessary electrical charges occupies a certain area on a substrate, which imposes limitations on miniaturization of a solid-state imaging element.

In addition, in a case where a stacked structure including a plurality of photodiodes that absorb light beams different in wavelength from one another is applied as a structure of each phase difference detection pixel including the light shielding film, for example, a phase difference is detected with one of the stacked photodiodes. In this case, because of the presence of the light shielding films, the other photodiodes stacked in each phase difference detection pixel are smaller in amount of incident light beams than photodiodes in a normal pixel including no light shielding film; therefore, each phase difference detection pixel is regarded as a defective pixel due to decrease in sensitivity. Accordingly, the photodiodes that are not used for detection of a phase difference are incapable of functioning as the photodiodes in the normal pixel, which may cause reduction in quality (such as resolution) of an image captured by a solid-state imaging element.

In view of the circumstances described above, hence, the present disclosure proposes: a novel and improved solid-state imaging element capable of actualizing a phase difference detection pixel that enables a finer pattern of pixels and also enables improvement in quality of a captured image in a stacked structure including a plurality of photodiodes; a method for manufacturing the solid-state imaging element; and an electronic apparatus.

Solution to Problem

According to the present disclosure, a solid-state imaging element is provided that includes: a plurality of pixels including at least two phase difference detection pixels for focus detection, wherein each pixel has a stacked structure including a plurality of photoelectric conversion elements that are stacked on top of each other and absorb light beams different in wavelength from one another to generate electrical charges, and each phase difference detection pixel includes, in the stacked structure, a color filter that partially covers an upper face of one of the photoelectric conversion elements and absorbs a light beam with a specific wavelength.

Moreover, according to the present disclosure, a method for manufacturing a solid-state imaging element including a plurality of pixels including at least two phase difference detection pixels for focus detection is provided that includes: stacking a plurality of photoelectric conversion elements that absorb light beams different in wavelength from one another to generate electrical charges; and forming a color filter that partially covers an upper face of one of the photoelectric conversion elements and absorbs a light beam with a specific wavelength.

Moreover, according to the present disclosure, an electronic apparatus is provided that includes: a solid-state imaging element including a plurality of pixels including at least two phase difference detection pixels for focus detection, wherein each pixel has a stacked structure including a plurality of photoelectric conversion elements that are stacked on top of each other and absorb light beams different in wavelength from one another to generate electrical charges, and each phase difference detection pixel includes, in the stacked structure, a color filter that partially covers an upper face of one of the photoelectric conversion elements and absorbs a light beam with a specific wavelength.

Advantageous Effects of Invention

As described above, according to the present disclosure, it is possible to actualize a phase difference detection pixel that enables a finer pattern of pixels and also enables improvement in quality of a captured image in a stacked structure including a plurality of photodiodes.

It should be noted that the foregoing advantageous effect is not necessarily limitative, and any advantageous effects described in the present specification or other advantageous effects to be understood from the present specification may be produced in addition to the foregoing advantageous effect or in place of the foregoing advantageous effect.

DESCRIPTION OF EMBODIMENTS

Figure 1:
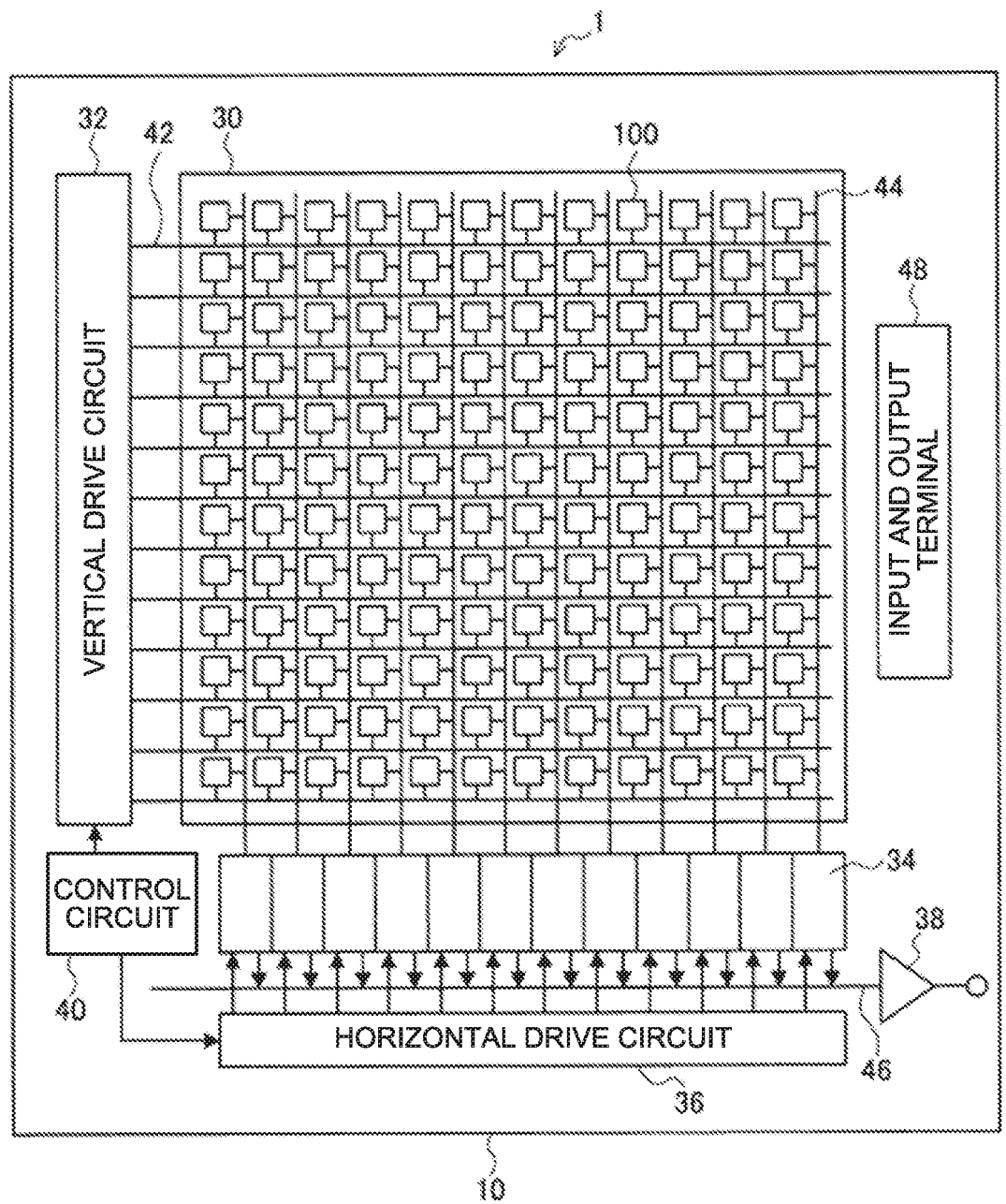
FIG. 1 is an explanatory view illustrating an exemplary planar configuration of a solid-state imaging element according to an embodiment of the present disclosure.

Hereinafter, preferred embodiments of the present disclosure will be described in detail with reference to the accompanying drawings. It should be noted in the present specification and the drawings that constituent elements that are substantially identical in function and configuration to one another are denoted with the same reference signs for avoidance of their repetitive description.

Also in the present specification and the drawings, constituent elements that are substantially identical or similar in function and configuration to one another are denoted with the same reference signs except for the last numerals in some instances in order to distinguish the constituent elements from one another. However, the constituent elements that are substantially identical or similar in function and configuration to one another are denoted with the same reference signs if the constituent elements are not necessarily distinguished from one another. In addition, similar constituent elements in different embodiments are denoted with the same reference signs except for the last alphabets in some instances in order to distinguish the constituent elements from one another. However, the similar constituent elements are denoted with the same reference signs if the constituent elements are not necessarily distinguished from one another.

The drawings for reference in the following description are merely used for illustrating an embodiment of the present disclosure and facilitating the understanding of an embodiment of the present disclosure. For ease of the understanding, the shapes, dimensions, ratios, and the like of constituent elements illustrated in the drawings are different from those of actual constituent elements in some instances. In addition, a solid-state imaging element illustrated in the drawings may be appropriately designed and changed in consideration of the following description and the known art. In describing a solid-state imaging element with reference to a sectional view, an upper-lower direction of a stacked structure in the solid-state imaging element corresponds to a relative direction on the assumption that a light incident surface of the solid-state imaging element is directed upward, and is therefore different from an upper-lower direction according to actual gravitational acceleration in some instances.

In the following description, the term "substantially identical" involves not only mathematic identification or equality, but also a difference (an error) allowable in operations of a solid-state imaging element according to an embodiment of the present disclosure. Also in the following description, the wording of a shape means a shape that is defined geometrically, and also means that a shape involving a difference (an error, a distortion) allowable in operations of a solid-state imaging element and steps of manufacturing the solid-state imaging element is regarded as a shape similar to the shape defined geometrically.

Also in the following description, the term "electrically connect" refers to a state in which a plurality of components are directly connected to one another or are indirectly connected to one another via any components.

The description is given in the following order.

1. Schematic Configuration of Solid-State Imaging Element

2. Specific Configuration of Normal Pixel

3. Background to How the Present Inventors Have Devised Embodiment of the Present Disclosure
  4. First Embodiment
    4.1 Specific Configurations of Phase Difference Detection Pixels
    4.2 Modifications
  5. Second Embodiment
    5.1 Specific Configurations of Phase Difference Detection Pixels Detecting Phase Difference Based on Blue Light Beams
    5.2 Specific Configurations of Phase Difference Detection Pixels Detecting Phase Difference Based on Red Light Beams
    5.3 Mixed Phase Difference Detection Pixels Detecting Phase Differences Based on Light Beams of Different Colors
  6. Third Embodiment
  7. Fourth Embodiment
  8. Fifth Embodiment
  9. Sixth Embodiment
  10. Seventh Embodiment
  11. Eighth Embodiment
  12. Conclusion
  13. Supplement <<1. Schematic Configuration of Solid-State Imaging Element>>

With reference to FIG. 1, first, a description will be given of a schematic configuration of a solid-state imaging element 1 according to an embodiment of the present disclosure. FIG. 1 is an explanatory view illustrating an exemplary planar configuration of a solid-state imaging element 1 according to an embodiment of the present disclosure. As illustrated in FIG. 1, a solid-state imaging element 1 according to an embodiment of the present disclosure includes: a semiconductor substrate 10 made of, for example, silicon; a pixel array part 30 where a plurality of pixels 100a re arranged in a matrix form, the pixel array part 30 being provided on the semiconductor substrate 10; and peripheral circuitry provided on the semiconductor substrate 10 so as to surround the pixel array part 30. In addition, the solid-state imaging element 1 includes as the peripheral circuitry a vertical drive circuit 32, column signal processing circuits 34, a horizontal drive circuit 36, an output circuit 38, a control circuit 40, and the like. Hereinafter, a description will be given of the details of each block in the solid-state imaging element 1.

(Pixel Array Part 30)

As described earlier, the pixel array part 30 has the plurality of pixels 100a rranged two-dimensionally in the matrix form. The pixels 100 include a normal pixel 100x that generates a signal for image generation, and a pair of phase difference detection pixels 100a and 100b that generate a signal for focus detection. That is, in the pixel array part 30, some normal pixels 100x are exchanged with phase difference detection pixels 100a and 100b.

Specifically, a phase difference detection pixel 100a and a phase difference detection pixel 100b provided in a pair each include, for example, a color filter 600a nd the like to be described later, and have asymmetric sensitivity with respect to incident angles of light beams. As described above, the phase difference detection pixels 100a and 100b provided in a pair have asymmetric sensitivity with respect to incident angles of light beams, which cause a shift of detected images. An imaging device (not illustrated) including the solid-state imaging element 1 calculates a phase shift amount based on this shift of images, calculates a defocus amount, and adjusts (moves) a shooting lens (not illustrated), thereby achieving an autofocus function. It should be noted that the phase difference detection pixels 100a and 100b provided in a pair may be arranged in a left-right direction (a horizontal direction) in FIG. 1 or may be arranged in an upper-lower direction (a vertical direction) in FIG. 1. In addition, the phase difference detection pixels 100a and 100b provided in a pair may be arranged side by side or may be arranged with a normal pixel 100x interposed therebetween.

Each pixel 100 includes a photodiode serving as a photoelectric conversion element, and a plurality of pixel transistors (e.g., metal-oxide-semiconductor (MOS) transistors). Specifically, the pixel transistors include, for example, four MOS transistors, that is, a transfer transistor, a select transistor, a reset transistor, and an amplification transistor.

Alternatively, each pixel 100 may have a common pixel structure. The pixel common structure is constituted of a plurality of photodiodes, a plurality of transfer transistors, one floating diffusion (floating diffusion region) to be shared, and one common transistor to be shared. That is, in the common pixel structure, the photodiodes and transfer transistors each constituting a unit pixel share one floating diffusion and one common transistor. A specific structure of a normal pixel 100x will be described later.

(Vertical Drive Circuit 32)

The vertical drive circuit 32 includes, for example, a shift register. The vertical drive circuit 32 selects one of pixel drive wires 42 and supplies pulses for driving pixels 100 to the selected pixel drive wire 42 to drive the pixels 100 on a row basis. In other words, the vertical drive circuit 32 successively scans the pixels 100 of the pixel array part 30 on a row basis in the vertical direction (the upper-lower direction in FIG. 1), and supplies pixel signals based on signal electrical charges generated in accordance with the amounts of light beams received by the photodiodes of the respective pixels 100, to the column signal processing circuits 34 (to be described later) through vertical signal lines 44.

(Column Signal Processing Circuits 34)

The column signal processing circuits 34 are respectively disposed for the columns of the pixels 100. Each column signal processing circuit 34 performs signal processing, such as noise removal, on pixel signals output from pixels 100 in one row, on a pixel column basis. For example, each column signal processing circuit 34 performs signal processing, such as correlated double sampling (CDS) and analog-degital (AD) conversion, for removing fixed pattern noise unique to each pixel.

(Horizontal Drive Circuit 36)

The horizontal drive circuit 36 includes, for example, a shift register. The horizontal drive circuit 36 successively outputs horizontal scanning pulses, thereby sequentially selecting the column signal processing circuits 34 and causing the column signal processing circuits 34 to respectively output pixel signals to a horizontal signal line 46.

(Output Circuit 38)

The output circuit 38 successively receives pixel signals from the column signal processing circuits 34 through the horizontal signal line 46, performs signal processing on the received pixel signals, and outputs the pixel signals subjected to the signal processing. The output circuit 38 may function as, for example, a functional unit configured to perform buffering. Alternatively, the output circuit 38 may perform processing such as black level adjustment, column variation correction, and various kinds of digital signal processing. It should be noted that the buffering refers to processing of temporarily storing pixel signals in order to compensate differences in processing speed and transfer speed, in exchanging the pixel signals. In addition, an input and output terminal 48 is a terminal for exchanging signals with an external device.

(Control Circuit 40)

The control circuit 40 receives an input clock and data for instructing, for example, an operation mode, and outputs data such as internal information of the solid-state imaging element 1. That is, the control circuit 40 generates clock signals and control signals as references of operations of the vertical drive circuit 32, column signal processing circuits 34, horizontal drive circuit 36, and the like, on the basis of vertical synchronizing signals, horizontal synchronizing signals, and master clocks. The control circuit 40 then outputs the generated clock signals and control signals to the vertical drive circuit 32, column signal processing circuits 34, horizontal drive circuit 36, and the like.

<<2. Specific Configuration of Normal Pixel>>

Figure 2:
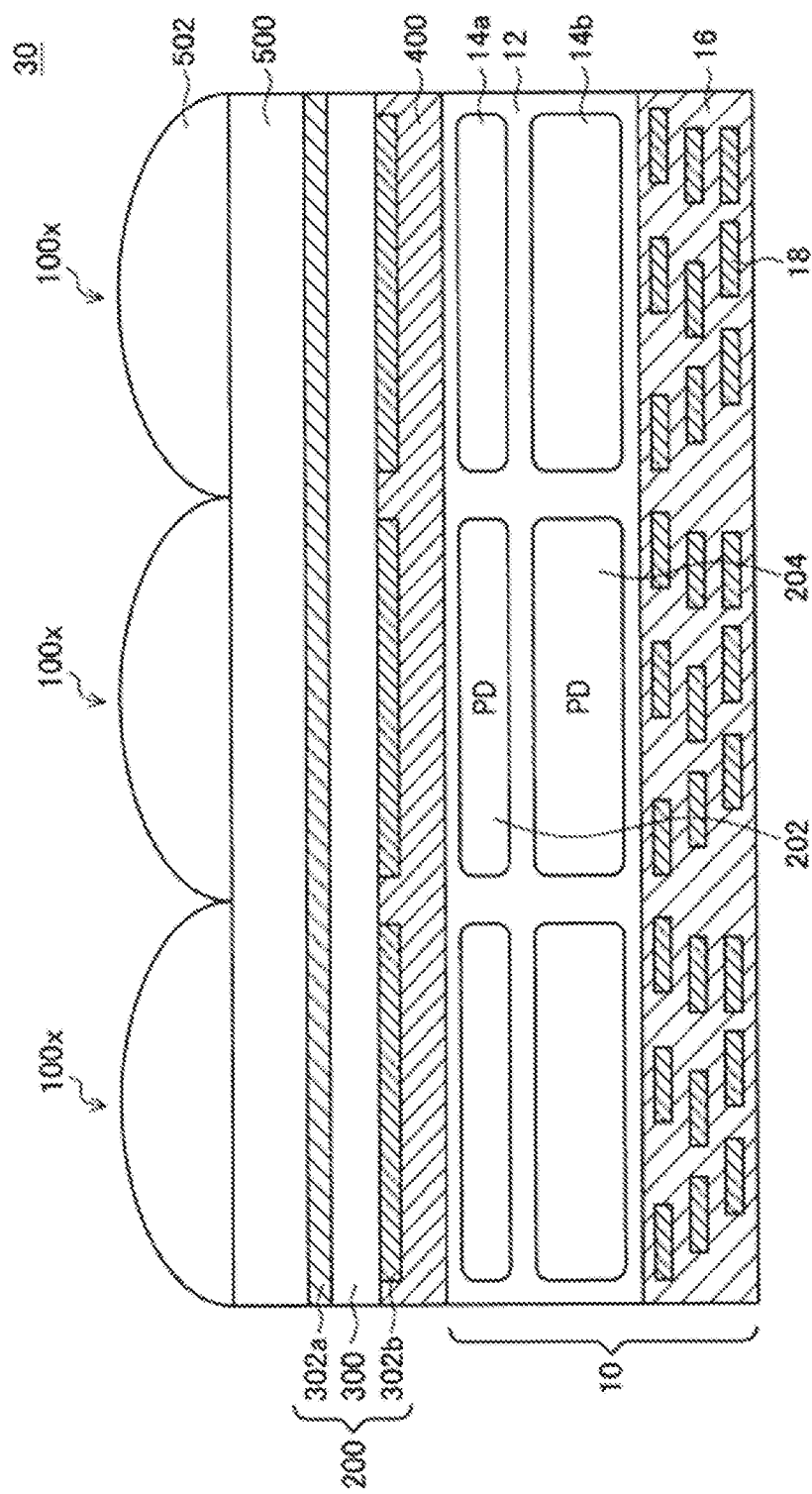
FIG. 2 is an explanatory view illustrating an exemplary sectional configuration of a normal pixel according to an embodiment of the present disclosure.

With reference to FIG. 2, next, a description will be given of a specific configuration in a sectional structure of a normal pixel 100a ccording to an embodiment of the present disclosure. FIG. 2 is an explanatory view illustrating exemplary sectional configurations of normal pixels 100x according to an embodiment of the present disclosure. Specifically, the exemplary sectional configurations correspond to sections of three normal pixels 100x cut along a thickness direction of a semiconductor substrate 10.

As illustrated in FIG. 2, in the normal pixels 100, the semiconductor substrate 10 made of, for example, silicon includes a semiconductor region 12 of a first conduction type (e.g., a P type), and two semiconductor regions 14a and 14b of a second conduction type (e.g., an N type). In the semiconductor region 12, the semiconductor region 14a is superimposed on the semiconductor region 14b in the thickness direction of the semiconductor substrate 10. The semiconductor regions 14a and 14b thus formed serve as two stacked photodiodes (PDs) (photoelectric conversion elements) 202 and 204 by PN junction. For example, the PD 202 having the semiconductor region 14a is a photodiode that receives and photoelectrically converts a blue light beam (e.g., a light beam with a wavelength in a range from 450 nm to 495 nm). The PD 204 having the semiconductor region 14b is a photodiode that receives and photoelectrically converts a red light beam (e.g., a light beam with a wavelength in a range from 620 nm to 750 nm).

The semiconductor substrate 10 also includes a wiring layer 16 provided in a region (the lower side in FIG. 2) located opposite the semiconductor region 12. Furthermore, the wiring layer 16 is provided with a plurality of pixel transistors (not illustrated) that read electrical charges generated at the PDs 202 and 204, and a plurality of wires 18 formed from tungsten (W), aluminum (Al), copper (Cu), or the like. It should be noted that FIG. 2 does not specifically illustrate the wiring layer 16.

The semiconductor substrate 10 may also include a plug (not illustrated) that outputs to the wiring layer 16 electrical charges photoelectrically converted by a photoelectric conversion film 300 to be described later, the plug being provided to penetrate through the semiconductor substrate 10. In this case, the plug may be connected to a floating diffusion part (not illustrated) provided in a semiconductor region of a second conduction type (e.g., an N type) provided in the semiconductor substrate 10, via the wires 18 provided in the wiring layer 16. The floating diffusion part is a region for temporarily holding electrical charges photoelectrically converted by the photoelectric conversion film 300.

As illustrated in FIG. 2, a transparent insulating film 400 is provided on the semiconductor substrate 10. The transparent insulating film 400 includes, for example, a laminated film of two or three hafnium oxide ($HfO_2$) films and silicon oxide films.

The photoelectric conversion film 300 is provided on the transparent insulating film 400 with the photoelectric conversion film 300 sandwiched between an upper electrode 302a and lower electrodes 302b. The photoelectric conversion film 300, the upper electrode 302a, and the lower electrodes 302b constitute a PD 200. The PD 200 is a photodiode that receives and photoelectrically converts, for example, a green light beam (e.g., a light beam with a wavelength in a range from 495 nm to 570 nm). It should be noted that each of the upper electrode 302a and the lower electrodes 302b may be formed of, for example, an indium tin oxide (ITO) film, an indium zinc oxide film, or the like. The material for the photoelectric conversion film 300 will be described in detail later.

As illustrated in FIG. 2, the upper electrode 302a is continuously provided for the plurality of pixels 100 in common. On the other hand, the lower electrodes 302b are respectively provided for the pixels 100 in a divided manner. Moreover, the lower electrodes 302b may be electrically connected to the forgoing plug (not illustrated) via wires (not illustrated) formed from tungsten, aluminum, copper, or the like and provided to penetrate through the transparent insulating film 400.

As illustrated in FIG. 2, a high refractive index layer 500 is provided on the upper electrode 302a. The high refractive index layer 500 includes an inorganic film such as a silicon nitride film (SiN), a silicon oxynitride film (SiON), or silicon carbide (SiC). Furthermore, on-chip lenses (lens parts) 502 are provided on the high refractive index layer 500. Each on-chip lens 502 may be formed from, for example, a silicon nitride film (SiN) or a resin material such as a styrene resin, an acrylic resin, a styrene-acrylic copolymer resin, or a siloxane resin.

As described above, each normal pixel 100x of the solid-state imaging element 1 according to an embodiment of the present disclosure has a stacked structure including the PDs 200, 202, and 204 respectively corresponding to light beams of three colors. In other words, the solid-state imaging element 1 is a longitudinal spectral solid-state imaging element in which the photoelectric conversion film 300 (the PD 200) formed above the semiconductor substrate 10 photoelectrically converts a green light beam, and the PD 202 and the PD 204 in the semiconductor substrate 10 photoelectrically convert a blue light beam and a red light beam, respectively.

It should be noted that the photoelectric conversion film 300 may be formed from an organic material or an inorganic material. For example, in a case where the photoelectric conversion film 300 is formed from an organic material, the organic material may be selected from four kinds: (a) a P-type organic semiconductor material; (b) an N-type organic semiconductor material; (c) a laminated structure including at least two of a P-type organic semiconductor material layer, an N-type organic semiconductor material layer, and a mixed layer (a bulk heterostructure) of a P-type organic semiconductor material with an N-type organic semiconductor material; and (d) a mixed layer of a P-type organic semiconductor material with an N-type organic semiconductor material.

Specific examples of the P-type organic semiconductor material may include a naphthalene derivative, an anthracene derivative, a phenanthrene derivative, a pyrene derivative, a perylene derivative, a tetracene derivative, a pentacene derivative, a quinacridone derivative, a thiophene derivative, a thienothiophene derivative, a benzothiophene derivative, a benzothienobenzothiophene derivative, a triallylamine derivative, a carbazole derivative, a perylene derivative, a picene derivative, a chrysene derivative, a fluoranthene derivative, a phthalocyanine derivative, a subphthalocyanine derivative, a subporphyrazine derivative, a metal complex with a heterocyclic compound as a ligand, a polythiophene derivative, a polybenzothiadiazole derivative, a polyfluorene derivative, and the like.

Examples of the N-type organic semiconductor material may include a fullerene and a fullerene derivative <e.g., a fullerene (a higher fullerene) such as C60, C70, or C74, an endohedral fullerene or the like) or a fullerene derivative (e.g., a fullerene fluoride, a phenyl-$C_{61}$-butyric acid methyl ester (PCBM) fullerene compound, a fullerene multimer, and the like)>, an organic semiconductor that is deeper in highest occupied molecular orbital (HOMO) and lowest unoccupied molecular orbital (LUMO) than a P-type organic semiconductor, a transparent inorganic metal oxide, and the like. More specific examples of the N-type organic semiconductor material may include a heterocyclic compound containing a nitrogen atom, an oxygen atom, or a sulfur atom, an organic molecule having, as a part of its molecular skeleton, for example, a pyridine derivative, a pyrazine derivative, a pyrimidine derivative, a triazine derivative, a quinoline derivative, a quinoxaline derivative, an isoquinoline derivative, an acridine derivative, a phenazine derivative, a phenanthroline derivative, a tetrazole derivative, a pyrazole derivative, an imidazole derivative, a thiazole derivative, an oxazole derivative, an imidazole derivative, a benzimidazole derivative, a benzotriazole derivative, a benzoxazole derivative, a benzoxazole derivative, a carbazole derivative, a benzofuran derivative, a dibenzofuran derivative, a subporphyrazine derivative, a polyphenylene vinylene derivative, a polybenzothiadiazole derivative, a polyfluorene derivative, or the like, an organic metal complex, and a subphthalocyanine derivative. Moreover, examples of a group and the like contained in the fullerene derivative may include: a branched or cyclic alkyl group or phenyl group; a group having a linear or condensed aromatic compound; a group having a halide; a partial fluoroalkyl group; a perfluoroalkyl group; an alkylsilyl group; an alkoxysilyl group; an arylsilyl group; an arylsulfanyl group; an alkylsulfanyl group; an arylsulfonyl group; an alkylsulfonyl group; an arylsulfide group; an alkylsulfide group; an amino group; an alkylamino group; an arylamino group; a hydroxy group; an alkoxy group; an acylamino group; an acyloxy group; a carbonyl group; a carboxy group; a carboxamide group; a carboalkoxy group; an acyl group; a sulfonyl group; a cyano group; a nitro group; a group having a chalcogenide; a phosphine group; a phosphonic group, and derivatives of these groups. It should be noted that the thickness of the photoelectric conversion film 300 formed from an organic material is not limited. For example, the thickness may be $1\times10^{-8}$ m to $5\times10^{-7}$ m, preferably $2.5\times10^{-8}$ m to $3\times10^{-7}$ m, more preferably $2.5\times10^{-8}$ m to $2\times10^{-7}$ m. In the foregoing description, moreover, the organic semiconductor materials are classified into a P type and an N type. Herein, a P type means that holes are easily transported, and an N type means that electrons are easily transported. In other words, an organic semiconductor material is not limited to such an interpretation that an organic semiconductor material has holes or electrons as majority carriers for thermal excitation like an inorganic semiconductor material.

More specifically, in order to function as the photoelectric conversion film 300 of the PD 200 that receives and photoelectrically converts a green light beam, the photoelectric conversion film 300 may contain, for example, a light absorption material such as a rhodamine dye, a melocyanine dye, a quinacridone derivative, or a subphthalocyanine dye (a subphthalocyanine derivative).

In the case where the photoelectric conversion film 300 is formed from an inorganic material, examples of the inorganic semiconductor material may include crystalline silicon, amorphous silicon, microcrystalline silicon, crystalline selenium, amorphous selenium, and CIGS (CuInGaSe), CIS (CuInSe$_2$), CuInS$_2$, CuAlS$_2$, CuAlSe$_2$, CuGaS$_2$, CuGaSe$_2$, AgAlS$_2$, AgAlSe$_2$, AgInS$_2$, and AgInSe$_2$ as chalcopyrite compounds. Alternatively, examples of the inorganic semiconductor material may include GaAs, InP, AlGaAs, InGaP, AlGaInP, and InGaAsP as III-V group compounds. Moreover, examples of the inorganic semiconductor material may include compound semiconductors such as CdSe, CdS, In$_2$Se$_3$, In$_2$S$_3$, Bi$_2$Se$_3$, Bi$_2$S$_3$, ZnSe, ZnS, PbSe, and PbS. In addition, in an embodiment of the present disclosure, quantum dots made of these materials may be used as the photoelectric conversion film 300.

It should be noted that the solid-state imaging element 1 according to an embodiment of the present disclosure is not limited to the stacked structure including the PD 200 provided above the semiconductor substrate 10 and including the photoelectric conversion film 300 and the PDs 202 and 204 provided in the semiconductor substrate 10. In the present embodiment, for example, the solid-state imaging element 1 may have a stacked structure including the PD 200 provided above the semiconductor substrate 10 and including the photoelectric conversion film 300 and the PD 202 provided in the semiconductor substrate 10, that is, a stacked structure including the two PDs 200 and 202. Also in the present embodiment, the solid-state imaging element 1 may have a stacked structure including the three PDs 200, 202, and 204 provided above the semiconductor substrate 10. In such a case, each of the PDs 200, 202, and 204 may include the photoelectric conversion film 300. In addition, each photoelectric conversion film 300 may be formed from an organic semiconductor material. In this case, in order to function as the photoelectric conversion film 300 of the PD 202 that receives and photoelectrically converts a blue light beam, the photoelectric conversion film 300 may contain, for example, a coumaric acid dye, tris-8-hydroxyquinoline aluminum (Alq3), a melocyanine dye, or the like. In order to function as the photoelectric conversion film 300 of the PD 204 that receives and photoelectrically converts a red light beam, the photoelectric conversion film 300 may contain a phthalocyanine dye, a subphthalocyanine dye (a subphthalocyanine derivative), or the like.

<<3. Background to How the Present Inventors Have Devised Embodiment of the Present Disclosure>>

Next, a description will be given of the background to how the present inventors have devised an embodiment of the present disclosure, prior to a specific description on each embodiment of the present disclosure.

As described earlier, an imaging device has employed, as an autofocus function, a method of detecting a phase difference, using a pair of phase difference detection pixels 100a and 100b having asymmetric sensitivity with respect to incident angles of light beams. For example, Patent Literature 1 actualizes phase difference detection pixels as follows. That is, phase difference detection pixels 100a and 100b respectively include divided lower electrodes 302b, and have light receiving surfaces of asymmetric shapes with respect to incident angles of light beams. Alternatively, the phase difference detection pixels 100a and 100b are also actualized by, for example, providing light shielding films so as to respectively cover halves of the light receiving surfaces. More specifically, the light shielding films are provided at symmetrical positions in the respective light receiving surfaces of the phase difference detection pixels 100a and 100b provided in a pair, so as to cover halves of the light receiving surfaces. Such phase difference detection pixels 100a and 100b are disclosed in, for example, Patent Literature 1.

For example, a study is conducted on a case of changing the shapes of lower electrodes 302b to actualize phase difference detection pixels 100a and 100b, in a stacked structure including three PDs 200, 202, and 204 that absorb light beams different in wavelength from one another, as in the solid-state imaging element 1 illustrated in FIG. 2. In such a case, the PD 200 of the phase difference detection pixels 100a and 100b is capable of detecting a phase difference. In addition, the PDs 202 and 204 located on the lower side of each of the phase difference detection pixels 100a and 100b are capable of exerting functions as in PDs 202 and 204 of a normal pixel 100x. However, in this case, unnecessary electrical charges are generated upon detection of a phase difference in the phase difference detection pixels 100a and 100b; therefore, it is necessary to provide a mechanism (e.g., a plug or the like) for discharging the unnecessary electrical charges, which imposes limitations on miniaturization of the solid-state imaging element 1.

On the other hand, in the case of the phase difference detection pixels 100a and 100b each provided with a light shielding film, it is unnecessary to provide a mechanism for discharging electrical charges. However, the PDs 202 and 204 located on the lower side of each of the phase difference detection pixels 100a and 100b are lower in amount of received light beams than the PDs 202 and 204 of the normal pixel 100x because of the presence of the light shielding films. As a result, the PDs 202 and 204 located on the lower side of each of the phase difference detection pixels 100a and 100b are incapable of exerting functions as in the PDs 202 and 204 of the normal pixel 100x provided with no light shielding film. In the solid-state imaging element 1, consequently, the number of photodiodes functioning as a photodiode of a normal pixel is reduced because of the presence of phase difference detection pixels 100a and 100b, which causes reduction in quality (such as resolution) of a captured image. In addition, if a light beam that is reflected by a light shielding film travels an unintended optical path, unnecessary electrical charges are occasionally generated at the PD 200 and the like of each of the phase difference detection pixels 100a and 100b. In this case, there is a possibility that the electrical charges may spread on surrounding pixels to exert adverse effects on the surrounding pixels (for example, to cause blooming or the like at the surrounding pixels).

In view of the situation described above, hence, the present inventors have devised such an embodiment of the present disclosure as to actualize phase difference detection pixels 100a and 100b that enable a finer pattern of pixels and also enable improvement in quality of a captured image in a stacked structure including a plurality of photodiodes (PDs 200, 202, and 204) in a longitudinal direction. Specifically, an embodiment of the present disclosure actualizes phase difference detection pixels 100a and 100b that enable a finer pattern of pixels and also enable improvement in quality of a captured image, by providing a color filter that absorbs a light beam with a specific wavelength in the foregoing stacked structure. In the following, embodiments of the present disclosure will be successively described in detail.

<<4. First Embodiment>>

<4.1 Specific Configurations of Phase Difference Detection Pixels>

Figure 3:
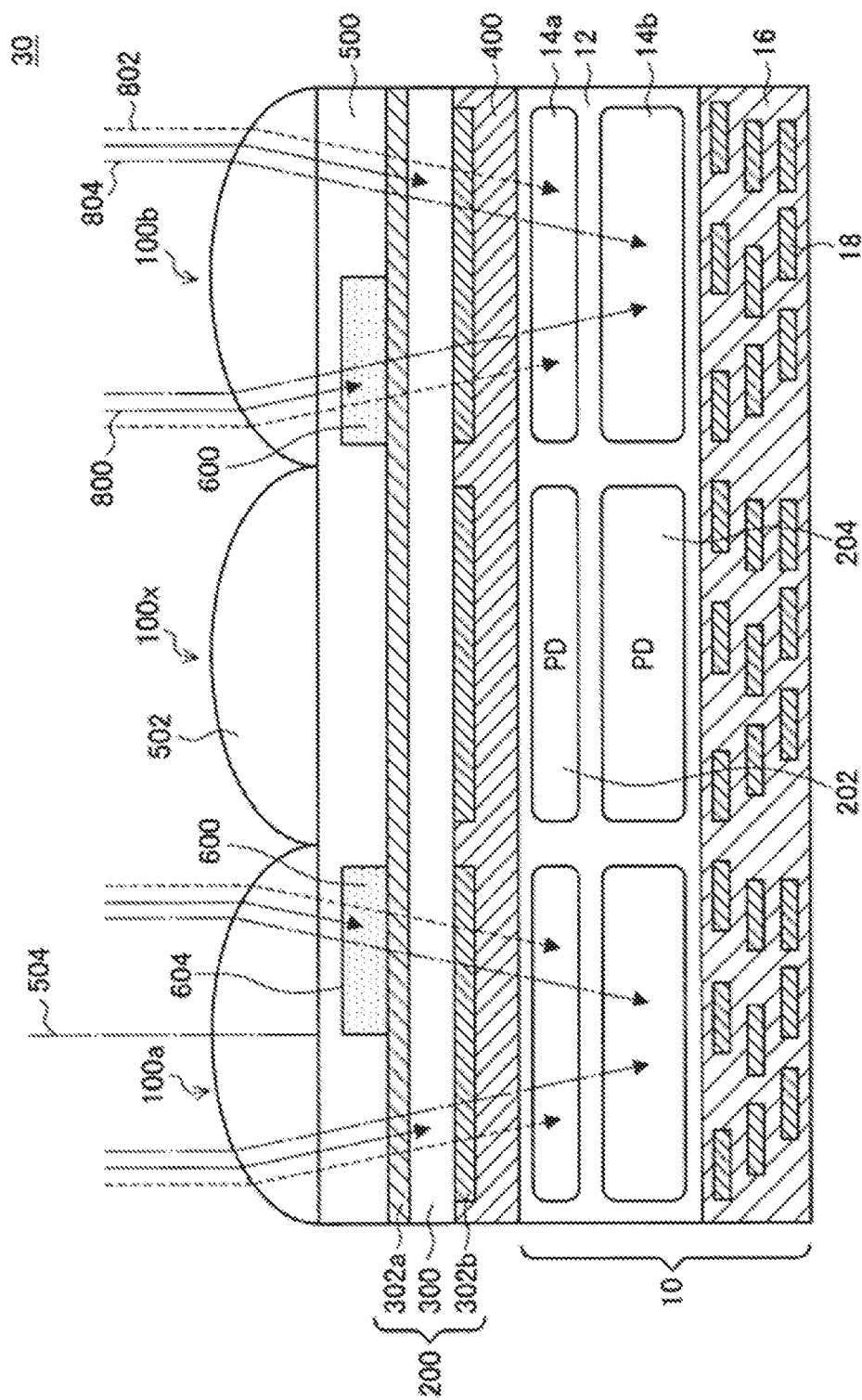
FIG. 3 is an explanatory view illustrating an exemplary sectional configuration of a phase difference detection pixel according to a first embodiment of the present disclosure.
Figure 4:
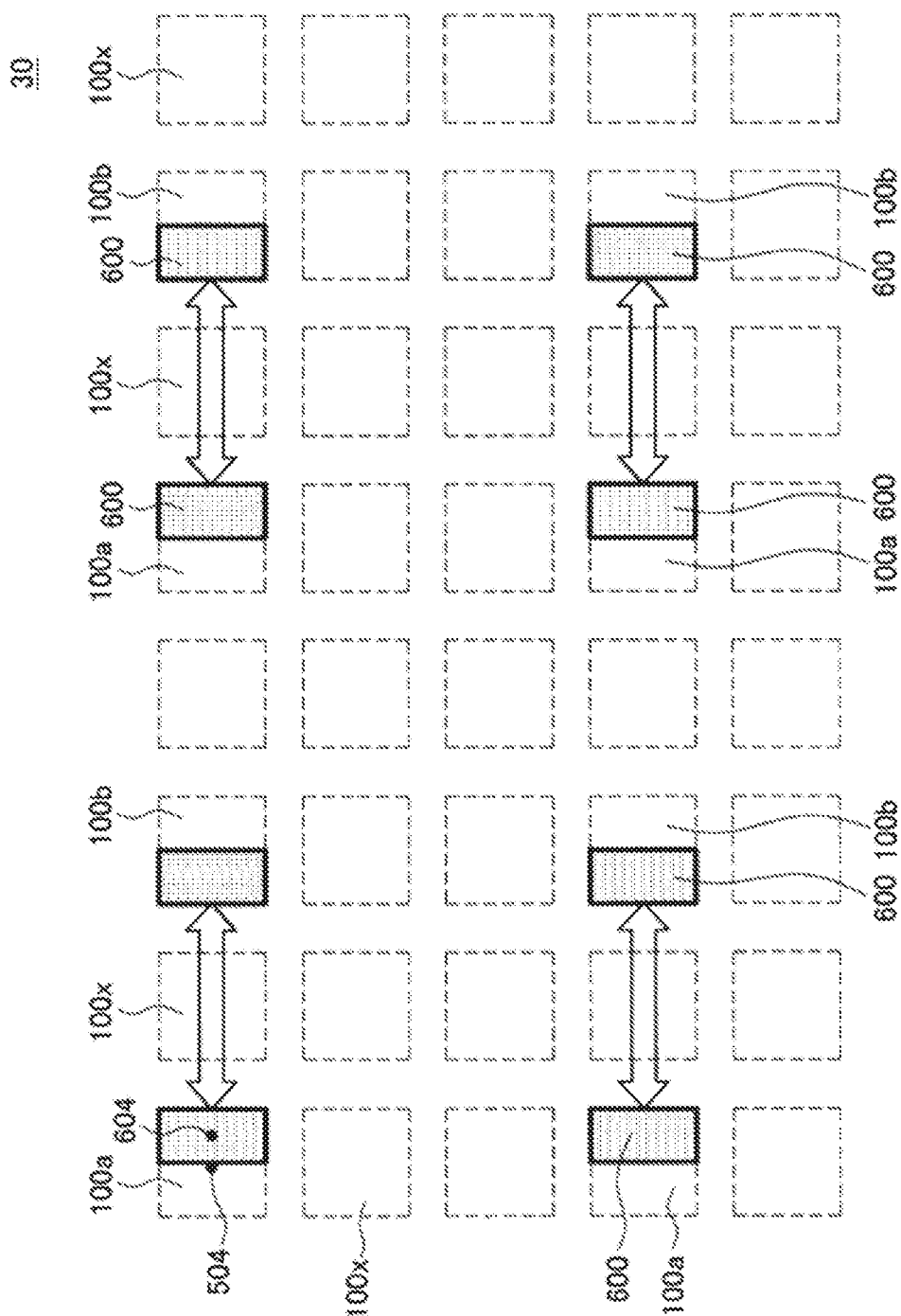
FIG. 4 is an explanatory view illustrating an exemplary planar configuration of a pixel array part according to the same embodiment.

With reference to FIGS. 3 and 4, first, a description will be given of specific configurations of phase difference detection pixels 100a and 100b according to a first embodiment of the present disclosure. FIG. 3 is an explanatory view illustrating exemplary sectional configurations of the phase difference detection pixels 100a and 100b according to the present embodiment. Specifically, the exemplary sectional configurations correspond to a section of a phase difference detection pixel 100a, a section of a normal pixel 100x, and a section of a phase difference detection pixel 100b, the pixels being cut along a thickness direction of a semiconductor substrate 10. In FIG. 3, an arrow 800 indicated by a solid line represents an optical path of a green light beam, an arrow 802 indicated by a broken line represents an optical path of a blue light beam, and an arrow 804 indicated by a chain line represents an optical path of a red light beam. FIG. 4 is an explanatory view illustrating an exemplary planar configuration of a pixel array part 30 according to the present embodiment. Specifically, FIG. 4 illustrates a part of the pixel array part 30 in a solid-state imaging element 1 with the semiconductor substrate 10 seen from above. FIG. 4 does not illustrate a high refractive index layer 500 and on-chip lenses 502 each provided above the semiconductor substrate 10, for the purpose of easily understanding positions of color filters 600 to be described later. In FIG. 4, moreover, a region indicated by a broken line represents one pixel.

As illustrated in FIG. 3, the phase difference detection pixels 100a and 100b are almost similar in stacked structure to the normal pixel 100x described earlier, except for color filters 600 provided on an upper electrode 302a. Specifically, the phase difference detection pixel 100a includes a color filter 600 having a rectangular shape. The color filter 600 is provided on the upper electrode 302a so as to cover right half of a light receiving surface of the phase difference detection pixel 100a. The phase difference detection pixel 100b also includes a color filter 600 having a rectangular shape. The color filter 600 is provided on the upper electrode 302a so as to cover left half of a light receiving surface of the phase difference detection pixel 100b. In other words, the phase difference detection pixels 100a and 100b are different from each other as to a position of a color filter 600 in a light receiving surface. The phase difference detection pixels 100a and 100b operate in a pair to detect a phase difference. It should be noted that a light receiving surface used herein refers to a surface, where stacked PDs 200, 202, and 204 receive light, of each of the normal pixel 100x, the phase difference detection pixel 100a, and the phase difference detection pixel 100b with the semiconductor substrate 10 seen from above. More specifically, a light receiving surface corresponds to a region where a pixel indicated by a broken line in the plan view of FIG. 4 is formed. In particular, as to a PD 200, a light receiving surface corresponds to a surface defined by a lower electrode 302b.

It should be noted in the present embodiment that each of the color filters 600 is not limited to such a configuration that each color filter 600 is formed to cover half of the corresponding light receiving surface. As illustrated in FIG. 4, for example, each color filter 600 may be formed such that a center point 604 on the center of a plane of the color filter 600 is different in position from an optical axis 504 of the corresponding on-chip lens 502. That is, in the present embodiment, each color filter 600 may be provided to cover a part of the corresponding light receiving surface. In the present embodiment, preferably, each color filter 600 is a rectangular color filter having an area that is one-half of an area of the corresponding light receiving surface. However, the area of each color filter 600 is allowable even when it is somewhat different from one-half of the area of the corresponding light receiving surface. In addition, as illustrated in FIG. 4, the pixel array part 30 may have a plurality of phase difference detection pixels 100a and 100b provided in a pair.

Figure 9:
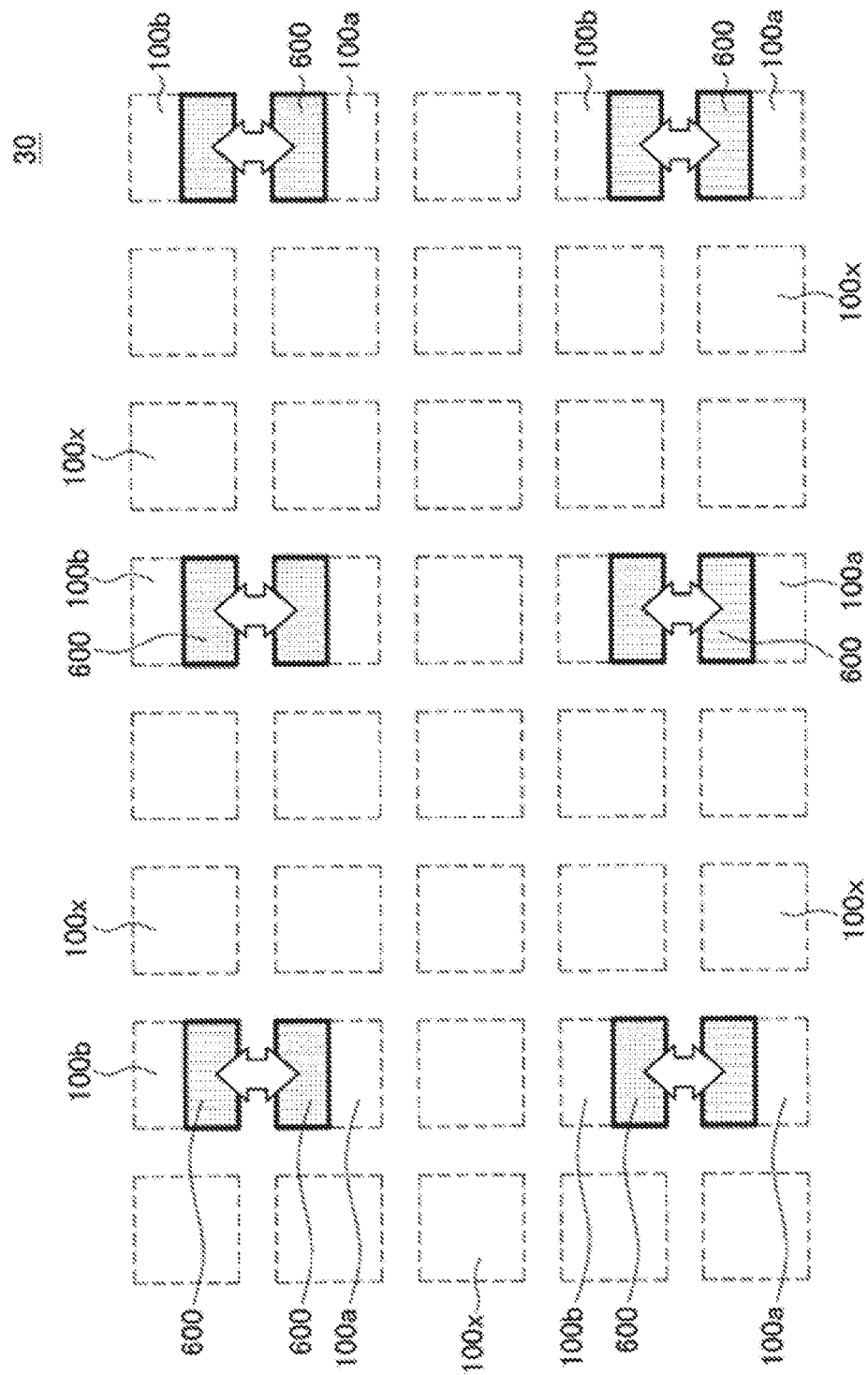
FIG. 9 is an explanatory view (part 1) illustrating an exemplary planar configuration of a pixel array part according to Modification 5 of the same embodiment.

As illustrated in FIGS. 3 and 4, phase difference detection pixels 100a and 100b provided in a pair may be juxtaposed to each other with one or more normal pixels 100x interposed therebetween or may be juxtaposed to each other with no normal pixel 100x interposed therebetween (see FIG. 9).

Each color filter 600 is a color filter (a magenta filter) that absorbs a green light beam. That is, each color filter 600 is capable of absorbing a light beam that is equal in wavelength to a light beam to be absorbed by the PD 200. Specifically, each color filter 600 may be formed from, for example, a resin material containing a rhodamine dye, a melocyanine dye, a quinacridone derivative, a subphthalocyanine dye (a subphthalocyanine derivative), or the like.

When the color filters 600a re provided as described above, the phase difference detection pixels 100a and 100b are formed to have asymmetric sensitivity with respect to incident angles of green light beams 800. In addition, since the phase difference detection pixels 100a and 100b are different in sensitivity from each other with respect to incident angles of green light beams 800, a phase shift occurs between an image detected by the phase difference detection pixel 100a and an image detected by the phase difference detection pixel 100b. According to the present embodiment, therefore, the PD 200 that receives and photoelectrically converts the green light beams 800 is capable of detecting a phase difference. Moreover, the color filters 600 prevent light beams unnecessary for detection of the phase difference from entering the PD 200 of the phase difference detection pixels 100a and 100b; therefore, unnecessary electrical charges are not generated upon detection of the phase difference. According to the present embodiment, therefore, it is unnecessary to provide a mechanism for discharging unnecessary electrical charges, which leads to further miniaturization of the solid-state imaging element 1.

As illustrated in FIG. 3, in addition, each color filter 600a llows transmission of a blue light beam 802 and a red light beam 804. Accordingly, the PDs 202 and 204 of each of the phase difference detection pixels 100a and 100b are capable of detecting the blue light beam 802 and the red light beam 804 as in the PDs 202 and 204 of the normal pixel 100x. Therefore, the PDs 202 and 204 of each of the phase difference detection pixels 100a and 100b can be used as in the PDs 202 and 204 of the normal pixel 100x. That is, according to the present embodiment, the PDs 202 and 204 of each of the phase difference detection pixels 100a and 100b are capable of functioning as the PDs 202 and 204 of the normal pixel 100x, which avoids decrease in quality (such as resolution) of a captured image. According to the present embodiment, furthermore, since a light shielding film is not provided, there is no possibility that unnecessary electrical charges are generated due to reflection by the light shielding film and spread on surrounding pixels to exert adverse effects on the surrounding pixels.

As illustrated in FIG. 4, on the pixel array part 30, the phase difference detection pixels 100a and 100b are juxtaposed to each other in the horizontal direction (the left-right direction in the figure) with the normal pixel 100x interposed therebetween. In addition, as described earlier, in the phase difference detection pixel 100a, the color filter 600 is provided on the upper electrode 302a so as to cover right half of the light receiving surface of the phase difference detection pixel 100a. On the other hand, in the phase difference detection pixel 100b, the color filter 600 is provided on the upper electrode 302a so as to cover left half of the light receiving surface of the phase difference detection pixel 100b. It can be said that the phase difference detection pixels 100a and 100b provided in a pair are juxtaposed to each other in the horizontal direction and respectively have the color filters 600 provided to cover the halves of the light receiving surfaces in the horizontal direction; therefore, the phase difference detection pixels 100a and 100b have high sensitivity for detection of a phase difference in the horizontal direction.

Preferably, the pixel array part 30 has a large number of normal pixels 100x in order to achieve a higher resolution of a captured image. However, if the number of phase difference detection pixels 100a and 100b is reduced, autofocusing loses accuracy or an autofocusing speed becomes slow. It is therefore preferable that the number of phase difference detection pixels 100a and 100b on the pixel array part 30, the positions of the phase difference detection pixels 100a and 100b formed on the pixel array part 30, and the like are appropriately selected in consideration of the balance between the resolution and the accuracy of autofocusing, and the like.

As described above, according to the present embodiment, it is possible to actualize the phase difference detection pixels 100a and 100b that enable a finer pattern of pixels and also enable improvement in quality of a captured image in the stacked structure including the PDs 200, 202, and 204.

<4.2 Modifications>

With reference to FIGS. 5 to 10, next, a description will be given of Modifications 1 to 5 of the present embodiment. FIGS. 5 to 10 are explanatory views respectively illustrating exemplary planar configurations of pixel array parts 30 according to Modifications 1 to 5 of the present embodiment. It should be noted that FIGS. 5 to 10 do not illustrate a high refractive index layer 500 and on-chip lenses 502 each provided above a semiconductor substrate 10, for the purpose of easily understanding positions of color filters 600, as in FIG. 4.

(Modification 1)

Figure 5:
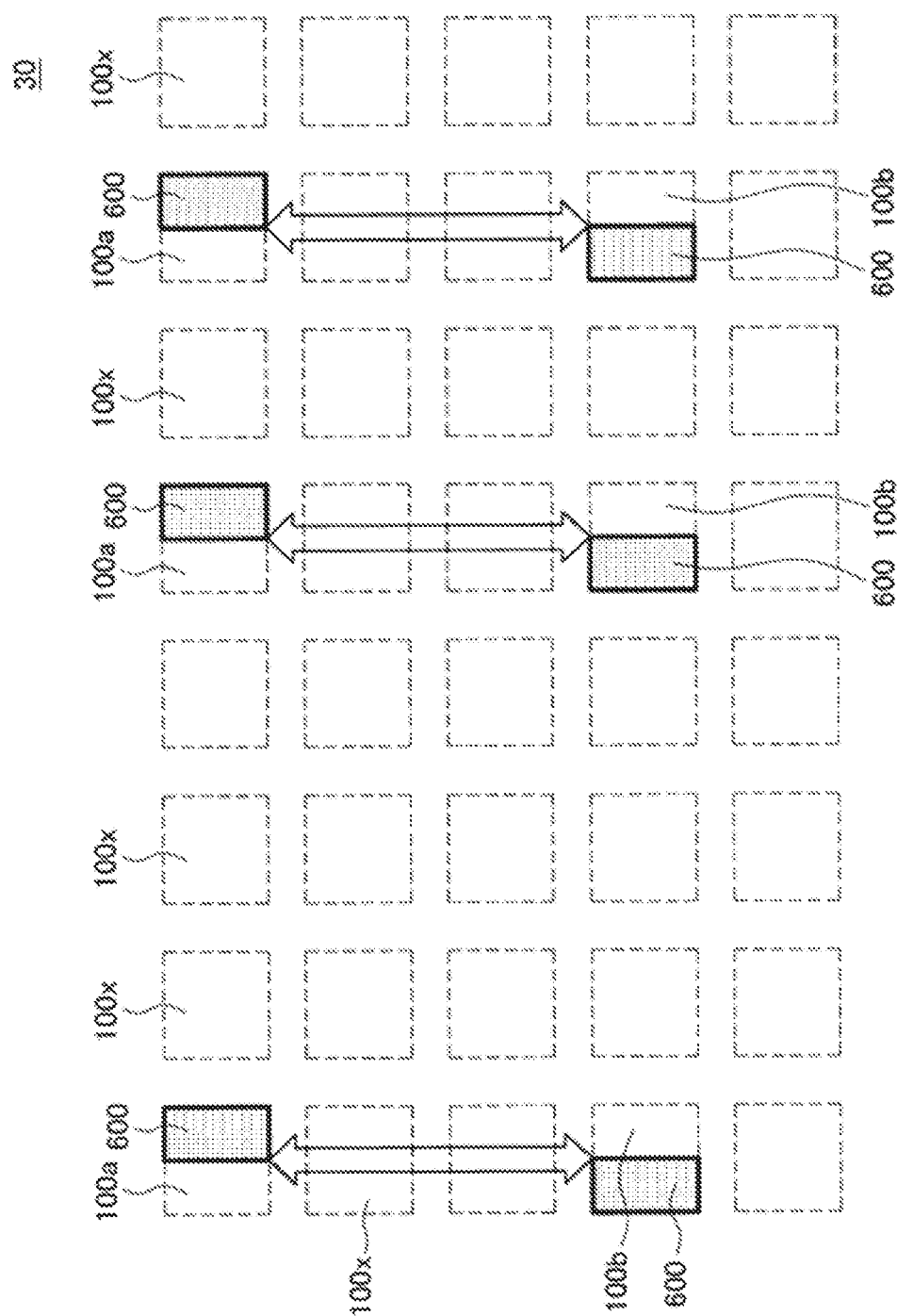
FIG. 5 is an explanatory view illustrating an exemplary planar configuration of a pixel array part according to Modification 1 of the same embodiment.

As illustrated in FIG. 5, according to Modification 1, on the pixel array part 30, phase difference detection pixels 100a and 100b provided in a pair may be juxtaposed to each other in the vertical direction (the upper-lower direction in the figure) with a plurality of normal pixels 100x interposed therebetween. As illustrated in FIG. 5, in the phase difference detection pixel 100a, a color filter 600 is provided on an upper electrode 302a so as to cover right half of a light receiving surface of the phase difference detection pixel 100a, as in the first embodiment. In the phase difference detection pixel 100b, a color filter 600 is provided on the upper electrode 302a so as to cover left half of a light receiving surface of the phase difference detection pixel 100b.

(Modification 2)

Figure 6:
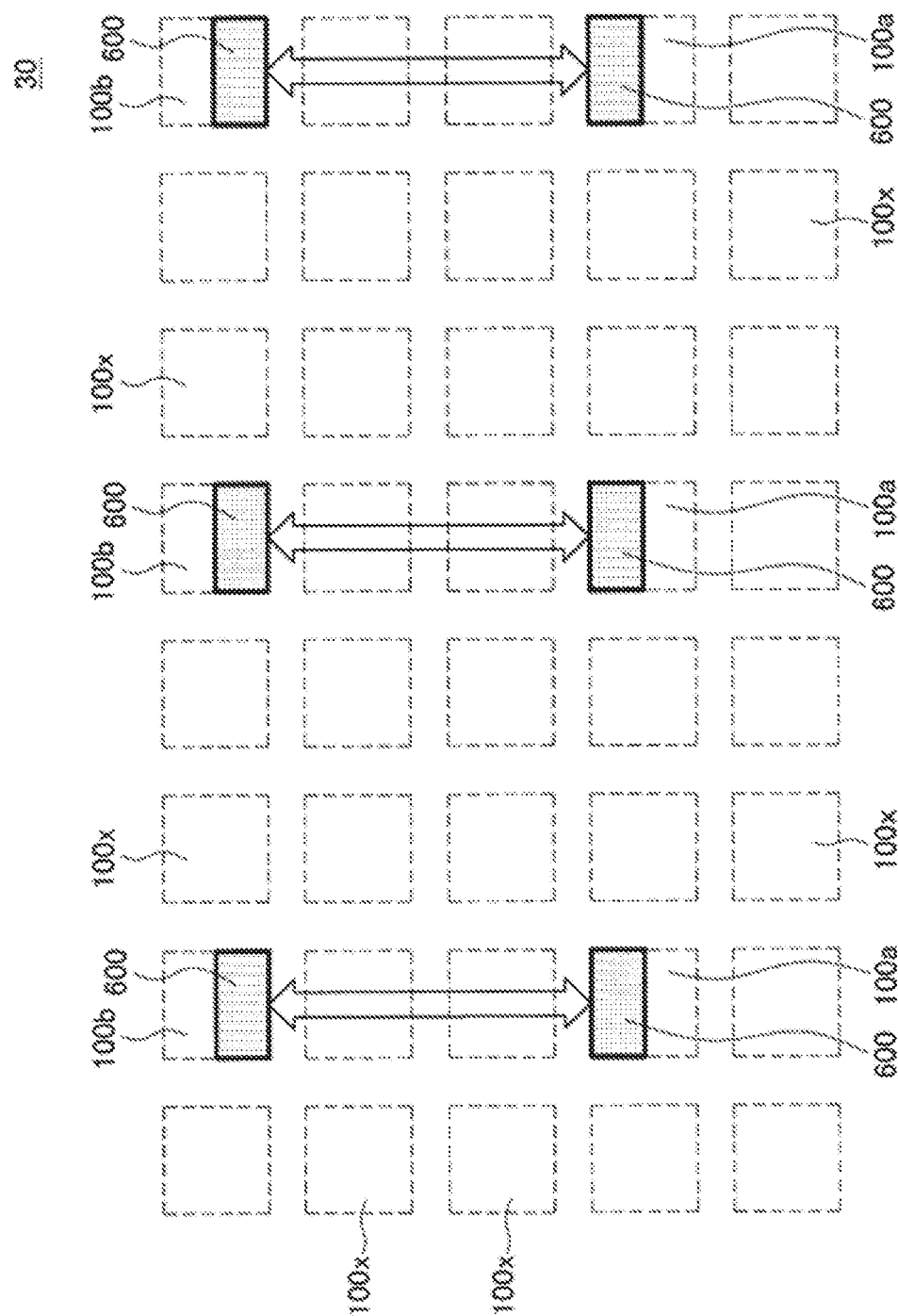
FIG. 6 is an explanatory view illustrating an exemplary planar configuration of a pixel array part according to Modification 2 of the same embodiment.

According to Modification 2, color filters 600 may be respectively provided to cover upper halves or lower halves of light receiving surfaces of phase difference detection pixels 100a and 100b. As illustrated in FIG. 6, specifically, in the phase difference detection pixel 100a, the color filter 600 is provided on an upper electrode 302a so as to cover upper half of the light receiving surface of the phase difference detection pixel 100*a*. In the phase difference detection pixel 100*b*, the color filter 600 is provided on the upper electrode 302*a* so as to cover lower half of the light receiving surface of the phase difference detection pixel 100*b*. As illustrated in FIG. 6, according to the present modification, on the pixel array part 30, phase difference detection pixels 100*a* and 100*b* provided in a pair may be juxtaposed to each other in the vertical direction (the upper-lower direction in the figure) with a plurality of normal pixels 100*x* interposed therebetween. It can be said that the phase difference detection pixels 100*a* and 100*b* provided in a pair are juxtaposed to each other in the vertical direction and respectively have the color filters 600 covering the halves of the light receiving surfaces in the vertical direction; therefore, the phase difference detection pixels 100*a* and 100*b* have high sensitivity for detection of a phase difference in the vertical direction.

(Modification 3)

Figure 7:
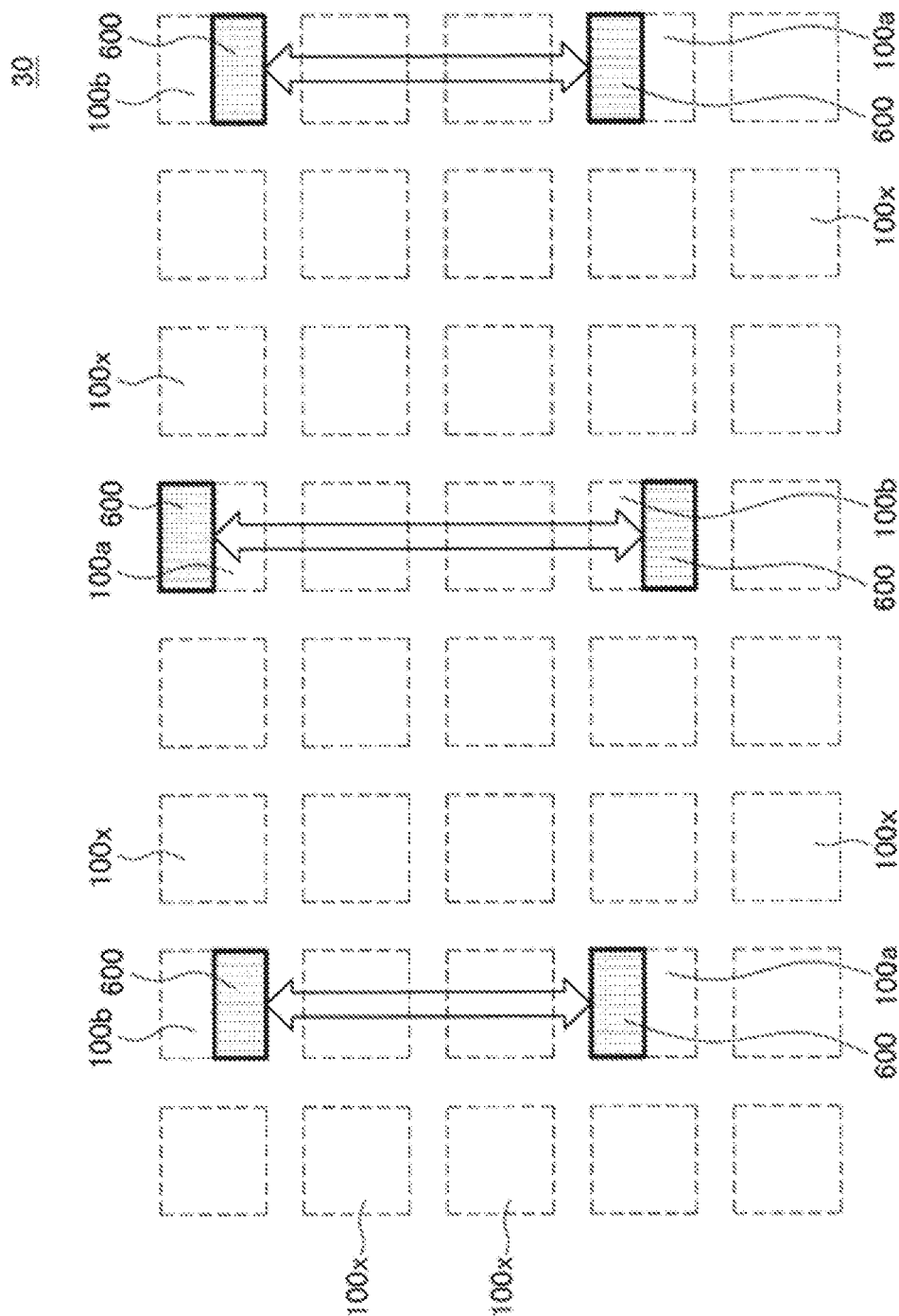
FIG. 7 is an explanatory view illustrating an exemplary planar configuration of a pixel array part according to Modification 3 of the same embodiment.

According to Modification 3, as in Modification 2, in a phase difference detection pixel 100*a*, a color filter 600 is provided to cover upper half of a light receiving surface of the phase difference detection pixel 100*a*. In a phase difference detection pixel 100*b*, a color filter 600 is provided to cover left half of a light receiving surface of the phase difference detection pixel 100*b*. According to the present modification, in addition, on the pixel array part 30, phase difference detection pixels 100*a* and 100*b* provided in a pair are juxtaposed to each other in the vertical direction (the upper-lower direction in the figure) with a plurality of normal pixels 100*x* interposed therebetween. However, Modification 3 is different from Modification 2 illustrated in FIG. 6 as to a positional relationship between a phase difference detection pixel 100*a* and a phase difference detection pixel 100*b*. As illustrated in FIG. 7, specifically, according to the present modification, a pair of phase difference detection pixels 100*a* and 100*b* provided in such a positional relationship that the phase difference detection pixel 100*a* is located on the upper side in the figure with respect to the phase difference detection pixel 100*b* and a pair of phase difference detection pixels 100*a* and 100*b* provided in such a positional relationship that the phase difference detection pixel 100*a* is located on the lower side in the figure with respect to the phase difference detection pixel 100*b* are arranged in a mixed state.

That is, as described in the first embodiment as well as Modifications 1 to 3, the color filters 600 of the phase difference detection pixels 100*a* and 100*b* may be respectively provided to cover the left and right halves of the light receiving surfaces or may be respectively provided to cover the upper and lower halves of the light receiving surfaces. In addition, a positional relationship between a phase difference detection pixel 100*a* and a phase difference detection pixel 100*b* provided in a pair is not particularly limited. On the pixel array part 30, the phase difference detection pixels 100*a* and 100*b* may be juxtaposed to each other in the horizontal direction (the left-right direction in the figure) or may be juxtaposed to each other in the vertical direction (the upper-lower direction in the figure). As described earlier, moreover, phase difference detection pixels 100*a* and 100*b* provided in a pair may be juxtaposed to each other with one or more normal pixels 100*x* interposed therebetween or may be juxtaposed to each other with no normal pixel 100*x* interposed therebetween.

(Modification 4)

Figure 8:
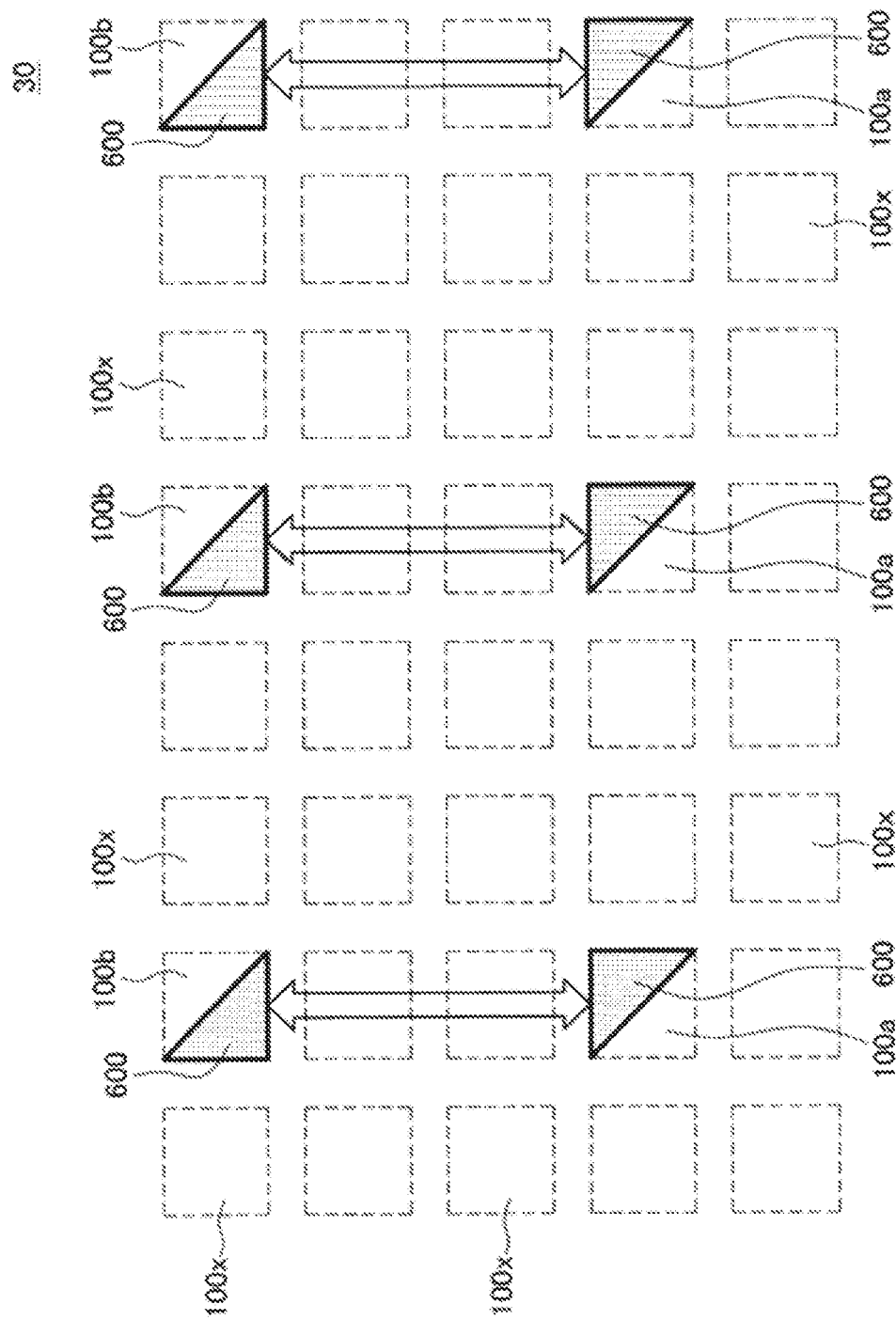
FIG. 8 is an explanatory view illustrating an exemplary planar configuration of a pixel array part according to Modification 4 of the same embodiment.

According to the first embodiment as well as Modifications 1 to 3, each color filter 600 is a rectangular color filter covering the left or right half of the corresponding light receiving surface or covering the upper or lower half of the corresponding light receiving surface. According to an embodiment of the present disclosure, however, the shape of each color filter 600 is not limited thereto. Each color filter 600 may be a triangular color filter covering diagonal half of a light receiving surface. As illustrated in FIG. 8, specifically, according to the present modification, in a phase difference detection pixel 100*a*, a color filter 600 is provided to cover upper diagonal half of a light receiving surface of the phase difference detection pixel 100*a*. In a phase difference detection pixel 100*b*, a color filter 600 is provided to cover lower diagonal half of a light receiving surface of the phase difference detection pixel 100*b*. According to the present modification, in addition, on the pixel array part 30, phase difference detection pixels 100*a* and 100*b* provided in a pair are juxtaposed to each other in the vertical direction (the upper-lower direction in the figure) with a plurality of normal pixels 100*x* interposed therebetween.

(Modification 5)

According to the first embodiment as well as Modifications 1 to 4, phase difference detection pixels 100*a* and 100*b* provided in a pair are juxtaposed to each other with one or more normal pixels 100*x* interposed therebetween. According to an embodiment of the present disclosure, however, phase difference detection pixels 100*a* and 100*b* provided in a pair may be juxtaposed to each other with no normal pixel 100*x* interposed therebetween. In such a case, furthermore, color filters 600 of the phase difference detection pixels 100*a* and 100*b* provided in a pair may be connected to each other and integrated into one. According to the present modification, the integrated color filter 600 achieves improvement in accuracy and reduction in time in processing the color filter 600.

As illustrated in FIG. 9, specifically, according to the present modification, on the pixel array part 30, phase difference detection pixels 100*a* and 100*b* provided in a pair are juxtaposed to each other in the vertical direction (the upper-lower direction in the figure) with no normal pixel 100*x* interposed therebetween. In addition, in the phase difference detection pixel 100*a*, a color filter 600 covers upper half of a light receiving surface of the phase difference detection pixel 100*a*. In the phase difference detection pixel 100*b*, a color filter 600 covers lower half of a light receiving surface of the phase difference detection pixel 100*b*.

Figure 10:
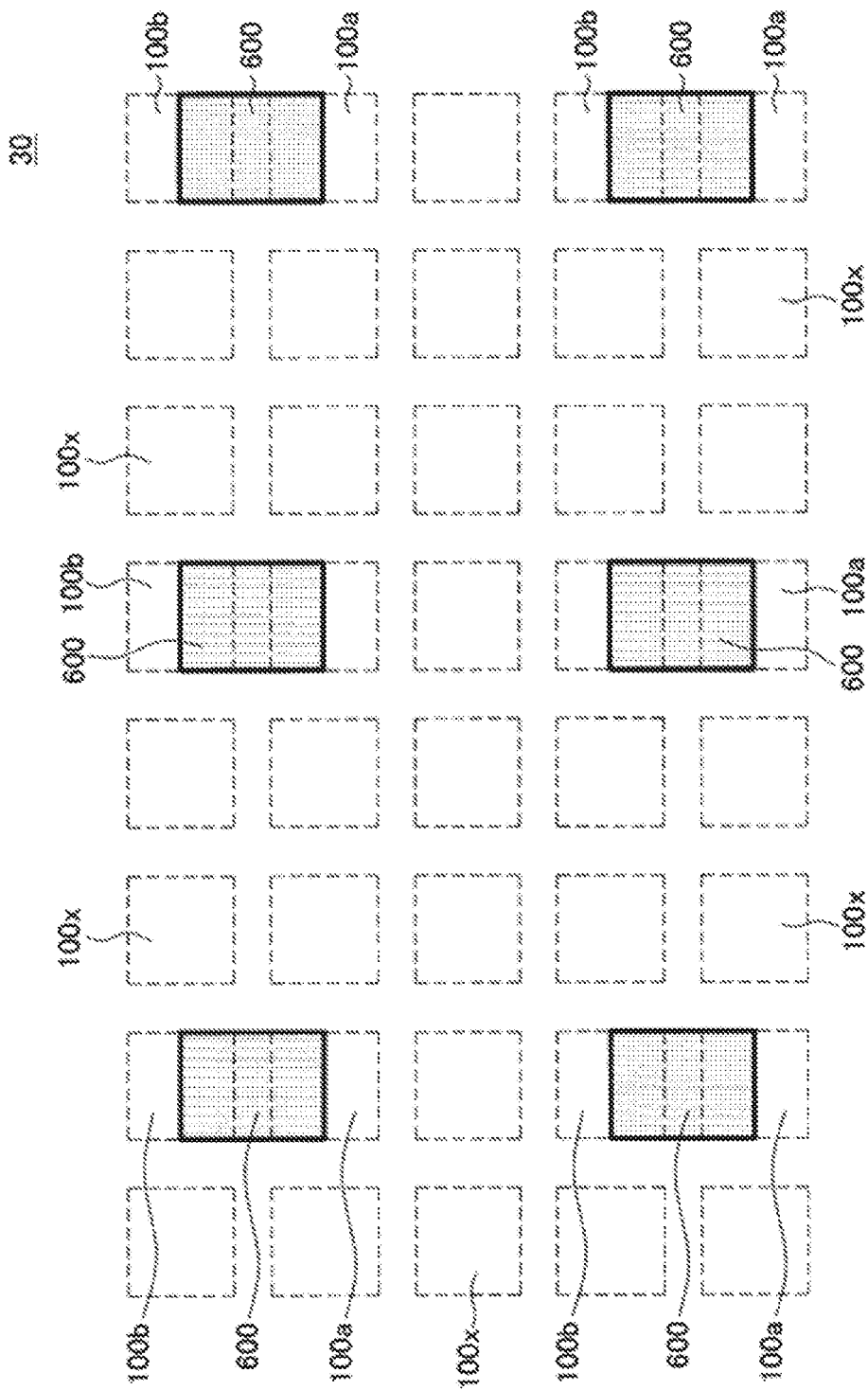
FIG. 10 is an explanatory view (part 2) illustrating an exemplary planar configuration of the pixel array part according to Modification 5 of the same embodiment.

In the case where the phase difference detection pixels 100*a* and 100*b* provided in a pair are juxtaposed to each other with no normal pixel 100*x* interposed therebetween, as illustrated in FIG. 10, color filters 600 of the phase difference detection pixels 100*a* and 100*b* provided in a pair may be connected to each other and integrated into one. That is, according to the present modification, a color filter 600 may be provided to cover upper half of the light receiving surface of the phase difference detection pixel 100*a* and lower half of the light receiving surface of the phase difference detection pixel 100*b*.

<<5. Second Embodiment>>

Figure 11:
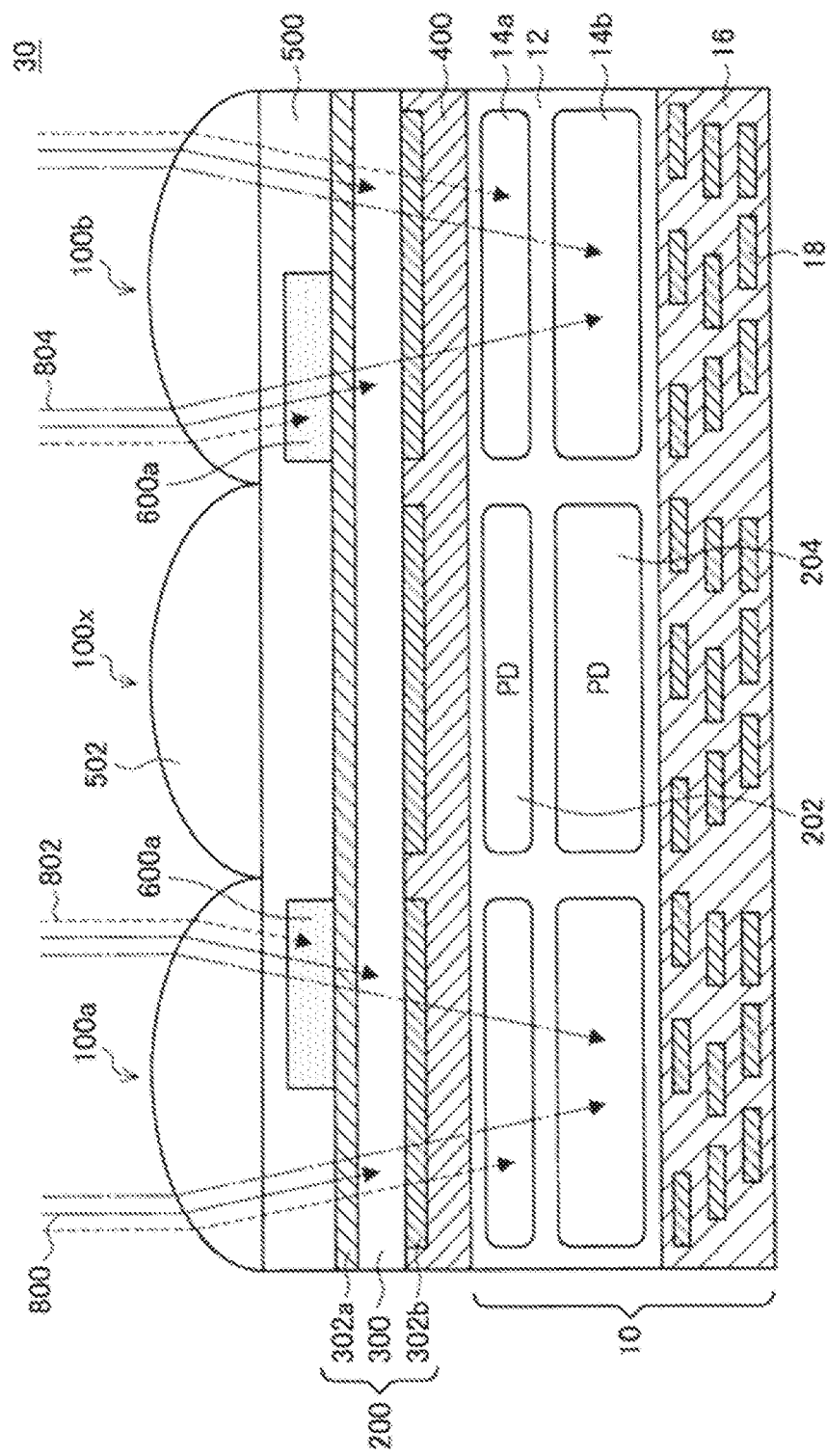
FIG. 11 is an explanatory view (part 1) illustrating an exemplary sectional configuration of a phase difference detection pixel according to a second embodiment of the present disclosure.
Figure 12:
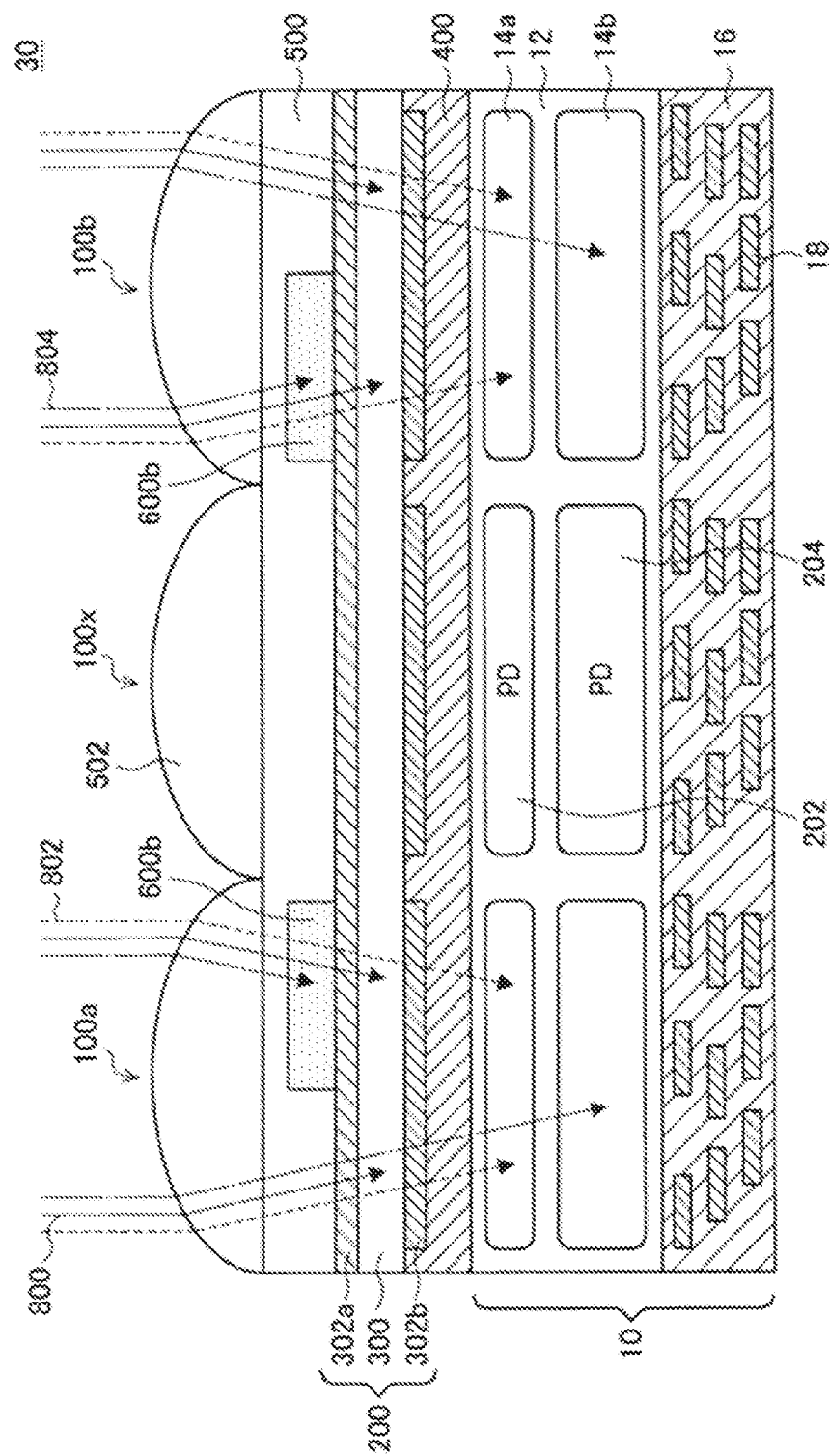
FIG. 12 is an explanatory view (part 2) illustrating an exemplary sectional configuration of the phase difference detection pixel according to the same embodiment.
Figure 13:
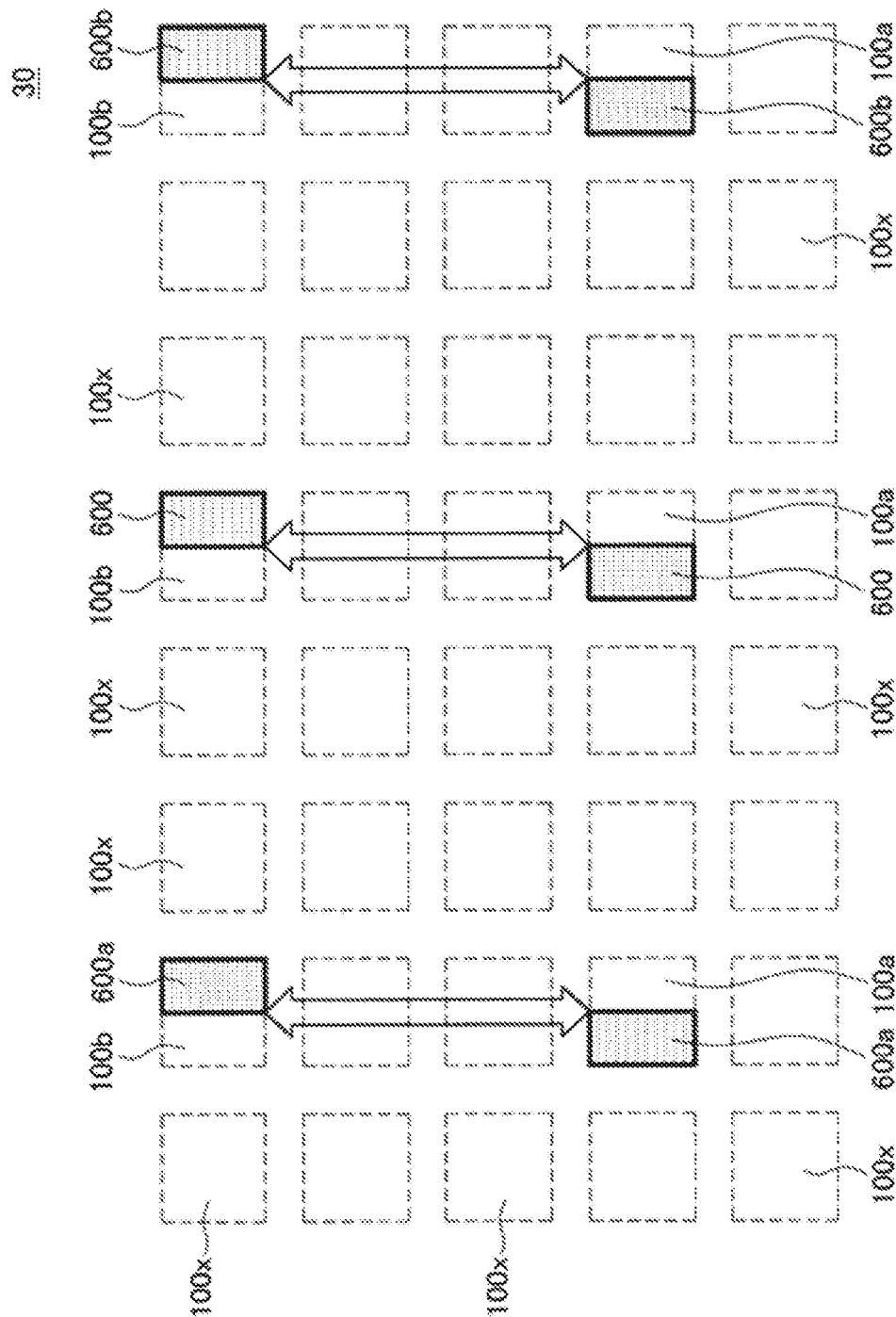
FIG. 13 is an explanatory view illustrating an exemplary planar configuration of a pixel array part according to the same embodiment.

According to the first embodiment, color filters 600 that absorb green light beams allow phase difference detection pixels 100*a* and 100*b* to detect a phase difference based on green light beams 800. However, an embodiment of the present disclosure is not limited to a phase difference detection pixel that detects a phase based on a green light beam 800. For example, an embodiment of the present disclosure may employ a phase difference detection pixel that detects a phase difference based on a blue light beam 802 or a phase difference detection pixel that detects a phase difference based on a red light beam 804. With reference to FIGS. 11 to 13, hereinafter, a description will be given of a second embodiment of the present disclosure. According to the second embodiment, a phase difference is detected on the basis of a blue light beam 802 or a red light beam 804. FIGS. 11 and 12 are explanatory views each illustrating exemplary sectional configurations of phase difference detection pixels 100a and 100b according to the present embodiment. Specifically, the exemplary sectional configurations correspond to a section of a phase difference detection pixel 100a, a section of a normal pixel 100x, and a section of a phase difference detection pixel 100b, the pixels being cut along a thickness direction of a semiconductor substrate 10. In FIGS. 11 and 12, as in FIG. 3, an arrow 800 indicated by a solid line represents an optical path of a green light beam, an arrow 802 indicated by a broken line represents an optical path of a blue light beam, and an arrow 804 indicated by a chain line represents an optical path of a red light beam. FIG. 13 is an explanatory view illustrating an exemplary planar configuration of a pixel array part 30 according to the present embodiment. It should be noted that FIG. 13 does not illustrate a high refractive index layer 500 and on-chip lenses 502 each provided above a semiconductor substrate 10, for the purpose of easily understanding positions of color filters 600a and 600b, as in FIG. 4.

<5.1 Specific Configurations of Phase Difference Detection Pixels Detecting Phase Difference Based on Blue Light Beams>

With reference to FIG. 11, first, a description will be given of phase difference detection pixels 100a and 100b that detect a phase difference based on blue light beams 802. As illustrated in FIG. 11, each of the phase difference detection pixels 100a and 100b according to the present embodiment is similar in stacked structure to each of the phase difference detection pixels 100a and 100b according to the first embodiment illustrated in FIG. 3. However, color filters 600a are different from the color filters according to the first embodiment. Each color filter 600a is a color filter (a yellow filter) that absorbs a blue light beam 802. That is, each color filter 600a is capable of absorbing a light beam that is equal in wavelength to a light beam to be absorbed by a PD 202. Specifically, each color filter 600a may be formed from, for example, a resin material containing a coumaric acid dye, tris-8-hydroxyquinoline aluminum ($Alq_3$), a melocyanine dye, or the like.

As described above, the color filters 600a that absorb blue light beams 802 allow the phase difference detection pixels 100a and 100b to detect a phase difference at the PDs 202 that receive and photoelectrically convert blue light beams 802. As illustrated in FIG. 11, in addition, each color filter 600a allows transmission of a green light beam 800 and a red light beam 804. Accordingly, PDs 200 and 204 of each of the phase difference detection pixels 100a and 100b are capable of detecting the green light beam 800 and the red light beam 804 as in PDs 200 and 204 of a normal pixel 100x. Therefore, the PDs 200 and 204 of each of the phase difference detection pixels 100a and 100b can be used as in the PDs 200 and 204 of the normal pixel 100x.

<5.2 Specific Configurations of Phase Difference Detection Pixels Detecting Phase Difference Based on Red Light Beams>

With reference to FIG. 12, next, a description will be given of phase difference detection pixels 100a and 100b that detect a phase difference based on red light beams 804. As illustrated in FIG. 12, each of the phase difference detection pixels 100a and 100b according to the present embodiment is also similar in stacked structure to each of the phase difference detection pixels 100a and 100b according to the first embodiment illustrated in FIG. 3. However, color filters 600b are different from the color filters according to the first embodiment. Each color filter 600b is a color filter (a cyan filter) that absorbs a red light beam 804. That is, each color filter 600b is capable of absorbing a light beam that is equal in wavelength to a light beam to be absorbed by a PD 204. Specifically, each color filter 600b may be formed from, for example, a resin material containing a phthalocyanine dye, a subphthalocyanine dye (a subphthalocyanine derivative), or the like.

As described above, the color filters 600b that absorb red light beams 804 allow the phase difference detection pixels 100a and 100b to detect a phase difference at PDs 202 that receive and photoelectrically convert the red light beams 804. As illustrated in FIG. 12, in addition, each color filter 600b allows transmission of a green light beam 800 and a blue light beam 802. Accordingly, PDs 200 and 202 of each of the phase difference detection pixels 100a and 100b are capable of detecting the green light beam 800 and the blue light beam 802 as in PDs 200 and 202 of a normal pixel 100x. Therefore, the PDs 200 and 202 of each of the phase difference detection pixels 100a and 100b can be used as in the PDs 200 and 202 of the normal pixel 100x.

<5.3 Mixed Phase Difference Detection Pixels Detecting Phase Differences Based on Light Beams of Different Colors>

In the first and second embodiments, phase difference detection pixels 100a and 100b detect a phase difference based on one of a green light beam 800, a blue light beam 802, and a red light beam 804, that is, detect a phase difference based on a light beam of a single color. However, an embodiment of the present disclosure is limited to detection of a phase difference based on a light beam of a single color. For example, an embodiment of the present disclosure may employ a combination of phase difference detection pixels 100a and 100b that respectively detect phase differences based on light beams of three colors. This configuration enables detection of phase differences in accordance with various light sources and subjects in imaging scenes.

As illustrated in FIG. 13, on a pixel array part 30, phase difference detection pixels 100a and 100b provided in a pair are juxtaposed to each other in the vertical direction (the upper-lower direction in the figure) with a normal pixel 100x interposed therebetween. Specifically, phase difference detection pixels 100a and 100b provided in a pair at the center of FIG. 13 each include a color filter 600, that is, function as phase difference detection pixels that are provided in a pair and detect a phase difference based on green light beams 800. Moreover, phase difference detection pixels 100a and 100b provided in a pair on the left side of FIG. 13 each include a color filter 600a, that is, function as phase difference detection pixels that are provided in a pair and detect a phase difference based on blue light beams 802. In addition, phase difference detection pixels 100a and 100b provided in a pair on the right side of FIG. 13 each include a color filter 600b, that is, function as phase difference detection pixels that are provided in a pair and detect a phase difference based on red light beams 804. As described above, one pixel array part 30 has a pair of phase difference detection pixels 100a and 100b that detect a phase difference based on light beams 800, a pair of phase difference detection pixels 100a and 100b that detect a phase difference based on light beams 802, and a pair of phase difference detection pixels 100a and 100b that detect a phase difference based on light beams 804, the light beams 800, 802, and 804 being different in color from one another. This configuration enables detection of phase differences based on light beams of three colors. Therefore, the example illustrated in FIG. 13 enables detection of a phase difference with higher accuracy in accordance with various light sources and subjects in imaging scenes, as compared with detection of a phase difference based on light beams of a single color.

As described above, according to the present embodiment, it is possible to actualize phase difference detection pixels 100a and 100b that enable a finer pattern of pixels, enable improvement in quality of a captured image, and also enable detection of phase differences based on three light beams 800, 802, and 804 different in wavelength (color) from one another. Preferably, phase difference detection pixels 100a and 100b that detect phase differences based on three light beams different in wavelength from one another are arranged in consideration of an array of normal pixels 100x arranged on the pixel array part 30 in accordance with the Bayer arrangement or the like.

<<6. Third Embodiment>>

Figure 14:
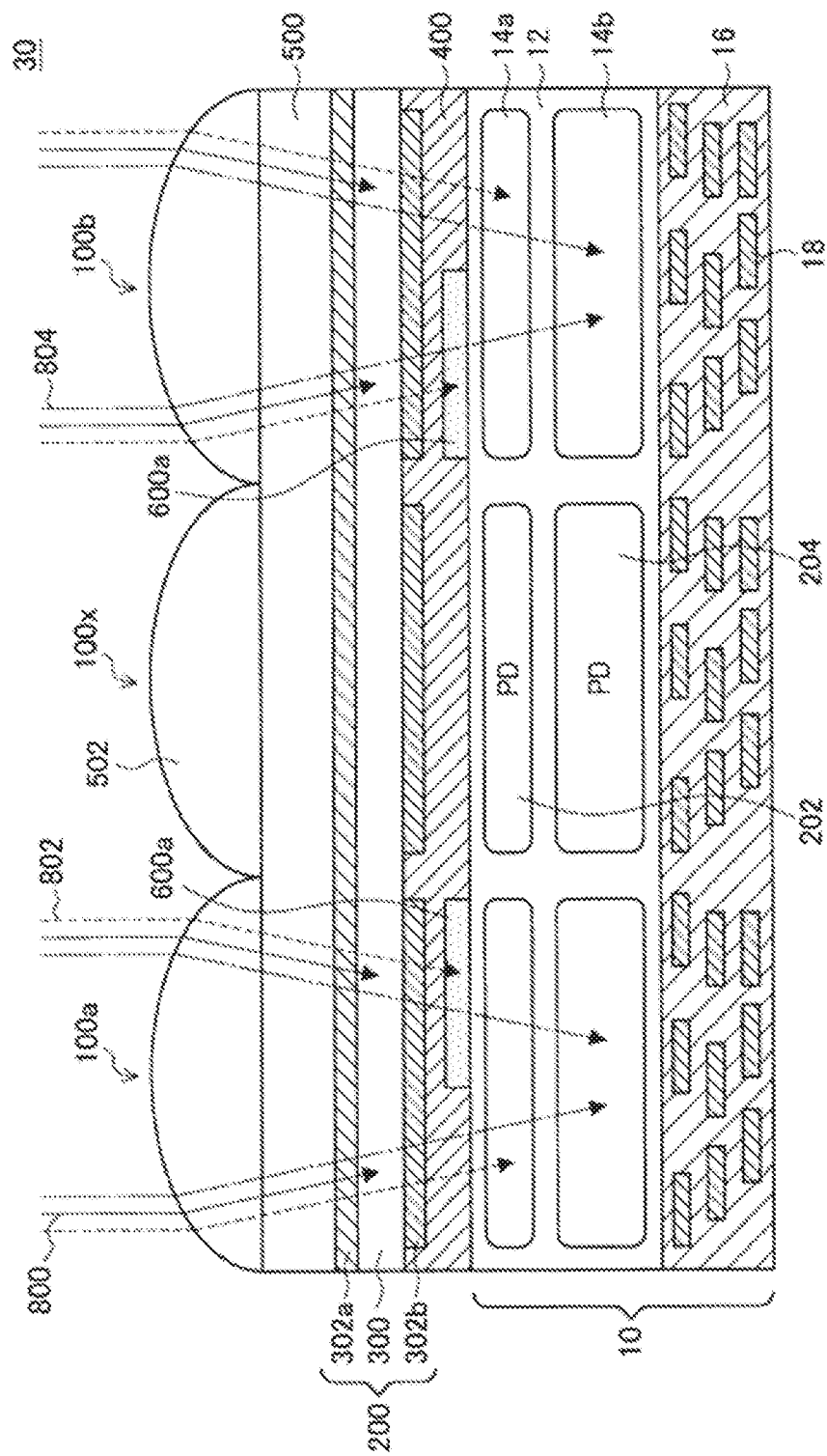
FIG. 14 is an explanatory view illustrating an exemplary sectional configuration of a phase difference detection pixel according to a third embodiment of the present disclosure.

In the case where phase difference detection pixels 100a and 100b detect a phase difference based on blue light beams 802 or red light beams 804 as described in the second embodiment, color filters 600a or 600b are not necessarily provided on an upper electrode 302a. More specifically, the color filters 600a or 600b may be respectively provided blow lower electrodes 302b. With reference to FIG. 14, hereinafter, a description will be given of a third embodiment of the present disclosure. According to the third embodiment, a color filter 600a is provided below a lower electrode 302b. FIG. 14 is an explanatory view illustrating exemplary sectional configurations of phase difference detection pixels 100a and 100b according to the present embodiment. Specifically, the exemplary sectional configurations correspond to a section of a phase difference detection pixel 100a, a section of a normal pixel 100x, and a section of a phase difference detection pixel 100b, the pixels being cut along a thickness direction of a semiconductor substrate 10. In FIG. 14, as in FIG. 3, an arrow 800 indicated by a solid line represents an optical path of a green light beam, an arrow 802 indicated by a broken line represents an optical path of a blue light beam, and an arrow 804 indicated by a chain line represents an optical path of a red light beam.

As illustrated in FIG. 14, each of the phase difference detection pixels 100a and 100b according to the present embodiment is also almost similar in stacked structure to each of the phase difference detection pixels 100a and 100b according to each of the first embodiment illustrated in FIG. 3 and the second embodiment. However, color filters 600a are different from the color filters according to the second embodiment, and are provided below lower electrodes 302b and on an upper face of a semiconductor substrate 10. That is, in the present embodiment, each color filter 600a is provided to cover half of an upper face of a corresponding one of PDs 202. In other words, the color filter 600a is provided to cover half of a light receiving surface of the PD 202. It should be noted that each color filter 600a is a color filter that absorbs a blue light beam 802.

As described above, the color filters 600a that absorb blue light beams 802 and are provided below the lower electrodes 302b and on the upper face of the semiconductor substrate 10 allow the phase difference detection pixels 100a and 100b to detect a phase difference at the PDs 202 that receive and photoelectrically convert blue light beams 802. As illustrated in FIG. 14, moreover, each color filter 600a allows transmission of a red light beam 804. Therefore, PDs 204 of the phase difference detection pixels 100a and 100b are capable of detecting red light beams 804 and red light beams 804 as in a PD 204 of a normal pixel 100x.

It should be noted in the present embodiment that the color filters 600a illustrated in FIG. 14 may be replaced with color filters 600b that absorb red light beams 804. In this case, phase difference detection pixels 100a and 100b are capable of detecting a phase difference at the PDs 204 that receive and electrically convert red light beams 804.

That is, an embodiment of the present disclosure is not particularly limited as to a color of a light beam for detection of a phase difference. In addition, a type of a color filter 600a nd a position of a color filter 600a re appropriately selectable in accordance with a desired phase difference detection light beam. Table 1 shows a combination of a type of a phase difference detection light beam, a type of a color filter 600 corresponding to a phase difference detection light beam, and a position of a color filter 600, in the present embodiment.

TABLE 1

| | | Type of color filter | |
|---|---|---|---|
| Position of color filter | | Above upper electrode | Below lower electrode |
| Phase difference detection light beam | Green light beam | Green light beam absorption type | — |
| | Blue light beam | Blue light beam absorption type | Blue light beam absorption type |
| | Red light beam | Red light beam absorption type | Red light beam absorption type |

As described above, according to the present embodiment, it is possible to actualize the phase difference detection pixels 100a and 100b that enable a finer pattern of pixels and also enable improvement in quality of a captured image even when a position of a color filter 600 differs.

<<7. Fourth Embodiment>>

The solid-state imaging element 1 according to an embodiment of the present disclosure is not limited to such a form that the floating diffusion part temporarily holds electrical charges subjected to photoelectric conversion by the photoelectric conversion film 300, but may employ such a form that the photoelectric conversion film 300 temporarily holds the electrical charges.

Figure 15:
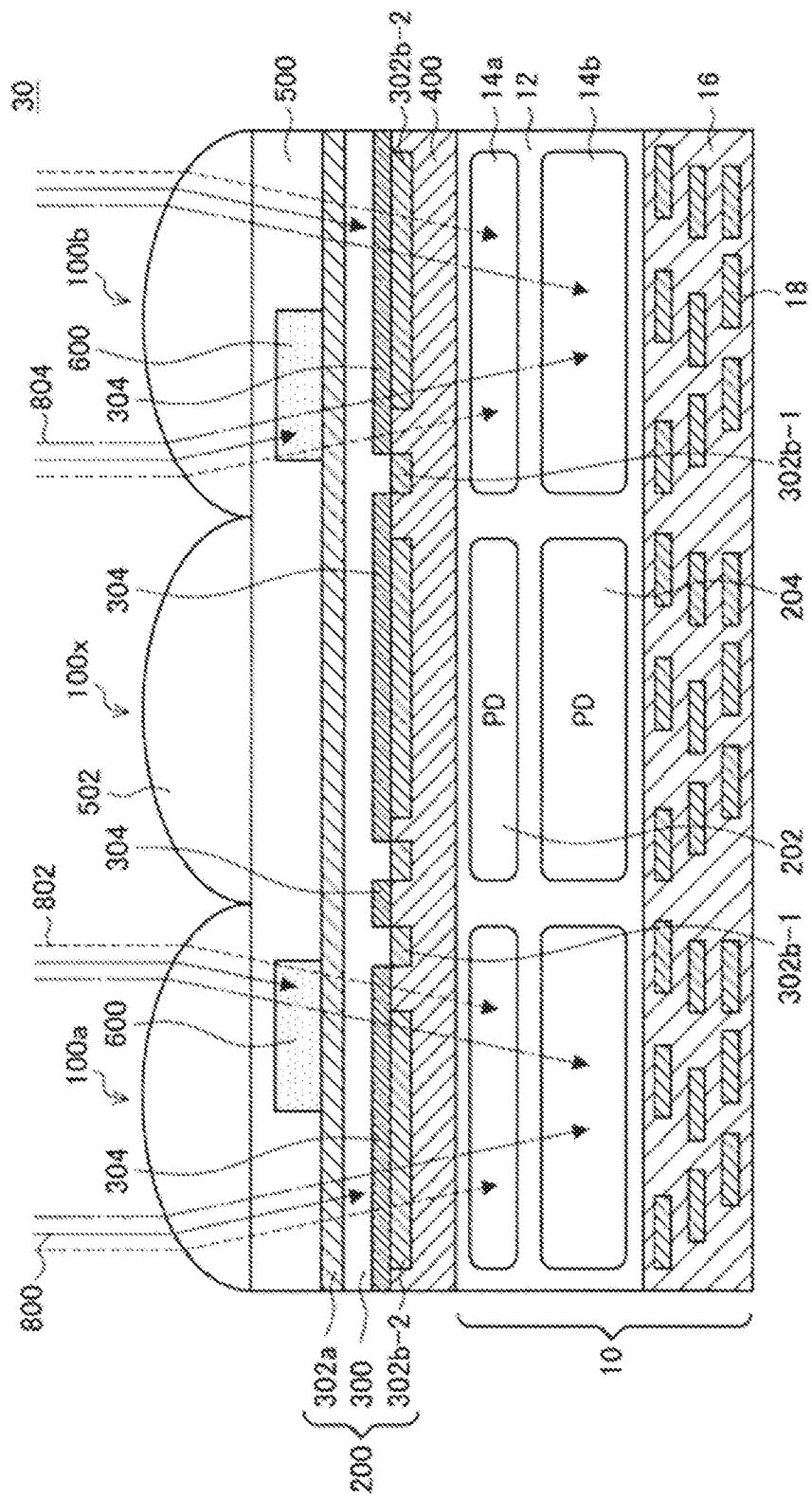
FIG. 15 is an explanatory view illustrating an exemplary sectional configuration of a phase difference detection pixel according to a fourth embodiment of the present disclosure.

With reference to FIG. 15, hereinafter, a description will be given of a fourth embodiment of the present disclosure. FIG. 15 is an explanatory view illustrating exemplary sectional configurations of phase difference detection pixels 100a and 100b according to the present embodiment. Specifically, the exemplary sectional configurations correspond to a section of a phase difference detection pixel 100a, a section of a normal pixel 100x, and a section of a phase difference detection pixel 100b, the pixels being cut along a thickness direction of a semiconductor substrate 10. In FIG. 15, as in FIG. 3, an arrow 800 indicated by a solid line represents an optical path of a green light beam, an arrow 802 indicated by a broken line represents an optical path of a blue light beam, and an arrow 804 indicated by a chain line represents an optical path of a red light beam.

As illustrated in FIG. 15, according to the present embodiment, the normal pixel 100x, the phase difference detection pixel 100a, and the phase difference detection pixel 100b each include a lower electrode 302b divided into a lower electrode 302b-1 and a lower electrode 302b-2. It should be noted in the present embodiment that each lower electrode 302b is not necessarily divided into two, and may be divided into at least two. Specifically, in each of the phase difference detection pixels 100a and 100b, for example, the lower electrode 302b-1 is formed to have an area smaller than an area of the lower electrode 302b-2. Also in the normal pixel 100x, likewise, the lower electrode 302b-1 is formed to have an area smaller than an area of the lower electrode 302b-2. In addition, these lower electrodes 302b-2 face a photoelectric conversion film 300 across an insulating film 304.

In the normal pixel 100x, moreover, the lower electrode 302b-2 is connected to a wire (not illustrated) to receive a desired electrical potential through the wire. The lower electrode 302b-1 is also connected to a wire (not illustrated) to receive a desired electrical potential through the wire. In addition, the lower electrode 302b-1 is connected to a floating diffusion part (not illustrated) provided on a semiconductor substrate 10, via a plug (not illustrated) or the like. In the present embodiment, controlling an electrical potential to be applied to the lower electrode 302b-1 and an electrical potential to be applied to the lower electrode 302b-2 enables accumulation of electrical charges, which are generated at the photoelectric conversion film 300, in the photoelectric conversion film 300 or enables output of the electrical charges to the floating diffusion part. In other words, the lower electrode 302b-2 functions as an electrical charge accumulating electrode that attracts electrical charges generated at the photoelectric conversion film 300 and causes the photoelectric conversion film 300 to accumulate the electrical charges, in accordance with an electrical potential to be applied thereto.

Examples of a material for the insulating film 304 may include not only inorganic insulating materials, for example, a silicon oxide material; silicon nitride (SiNy); and a metal oxide high dielectric insulating material such as aluminum oxide ($Al_2O_3$), but also organic insulating materials (organic polymers), for example, polymethyl methacrylate (PMMA); polyvinylphenol (PVP); polyvinyl alcohol (PVA); polyimide; polycarbonate (PC); polyethylene terephthalate (PET); polystyrene; silanol derivatives (silane coupling agents) such as N-2 (aminoethyl) 3-aminopropyltrimethoxysilane (AEAPTMS), 3-mercaptopropyltrimethoxysilane (MPTMS), and octadecyltrichlorosilane (OTS); a novolac-type phenol resin; a fluororesin; and linear hydrocarbons, each having at its one end a functional group bondable to a control electrode, such as octadecane thiol and dodecyl isocyanate. In addition, in the present embodiment, these materials may be used in combinations. Examples of the silicon oxide material may include silicon oxide ($SiO_x$), BPSG, PSG, BSG, AsSG, PbSG, silicon oxynitride (SiON), spin-on-glass (SOG), and a low-dielectric constant material (e.g., polyaryl ether, cycloperfluorocarbon polymer and benzocyclobutene, cyclic fluororesin, polytetrafluoroethylene, fluorinated aryl ether, fluorinated polyimide, amorphous carbon, organic SOG).

A specific description will be further given of the phase difference detection pixels 100a and 100b illustrated in FIG. 15. Also in the present embodiment, the phase difference detection pixels 100a and 100b are similar in structure to the foregoing normal pixel 100x. In addition, each of the phase difference detection pixels 100a and 100b includes a color filter 600 covering a part of a light receiving surface thereof, as in the phase difference detection pixels 100a and 100b according to the foregoing embodiments. In each of the phase difference detection pixels 100a and 100b, therefore, a portion of the photoelectric conversion film 300, which is not covered with the color filter 600, is capable of absorbing a green light beam 800, thereby generating electrical charges. The electrical charges thus generated can be accumulated in the photoelectric conversion film 300 or output to the outside in accordance with an electrical potential to be applied to the corresponding lower electrode 302b-1 and an electrical potential to be applied to the corresponding lower electrode 302b-2, as in the foregoing normal pixel 100x. Accordingly, the use of the electrical charges enables detection of a phase difference.

On the other hand, a portion of the photoelectric conversion film 300, which is located below the color filter 600, is incapable of absorbing a green light beam 800 because of the presence of the color filter 600, and is therefore incapable of generating electrical charges. Therefore, the phase difference detection pixel 100a and the phase difference detection pixel 100b have asymmetric sensitivity with respect to incident angles of light beams since the positions of the color filters 600 in the light receiving surfaces lean rightward or leftward in the figure. In addition, since the phase difference detection pixels 100a and 100b are different in sensitivity from each other with respect to incident angles of green light beams 800, a phase difference occurs between an image detected by the phase difference detection pixel 100a and an image detected by the phase difference detection pixel 100b. As a result, also in the present embodiment, a pair of phase difference detection pixels 100a and 100b is capable of detecting a phase difference.

That is, according to the present embodiment, even in a solid-state imaging element 1 that allows a photoelectric conversion film 300 to temporarily hold electrical charges, it is possible to actualize phase difference detection pixels 100a and 100b in such a manner that color filters 600a re provided to partially cover light receiving surfaces of the phase difference detection pixels 100a and 100b. Also in each of the phase difference detection pixels 100a and 100b according to the present embodiment, the PDs 202 and 204 can be used as in the PDs 202 and 204 of the normal pixel 100x.

According to the present embodiment, therefore, it is possible to actualize phase difference detection pixels 100a and 100b that enable improvement in quality of a captured image even in such a form that a photoelectric conversion film 300 temporarily holds electrical charges.

<<8. Fifth Embodiment>>

Figure 16:
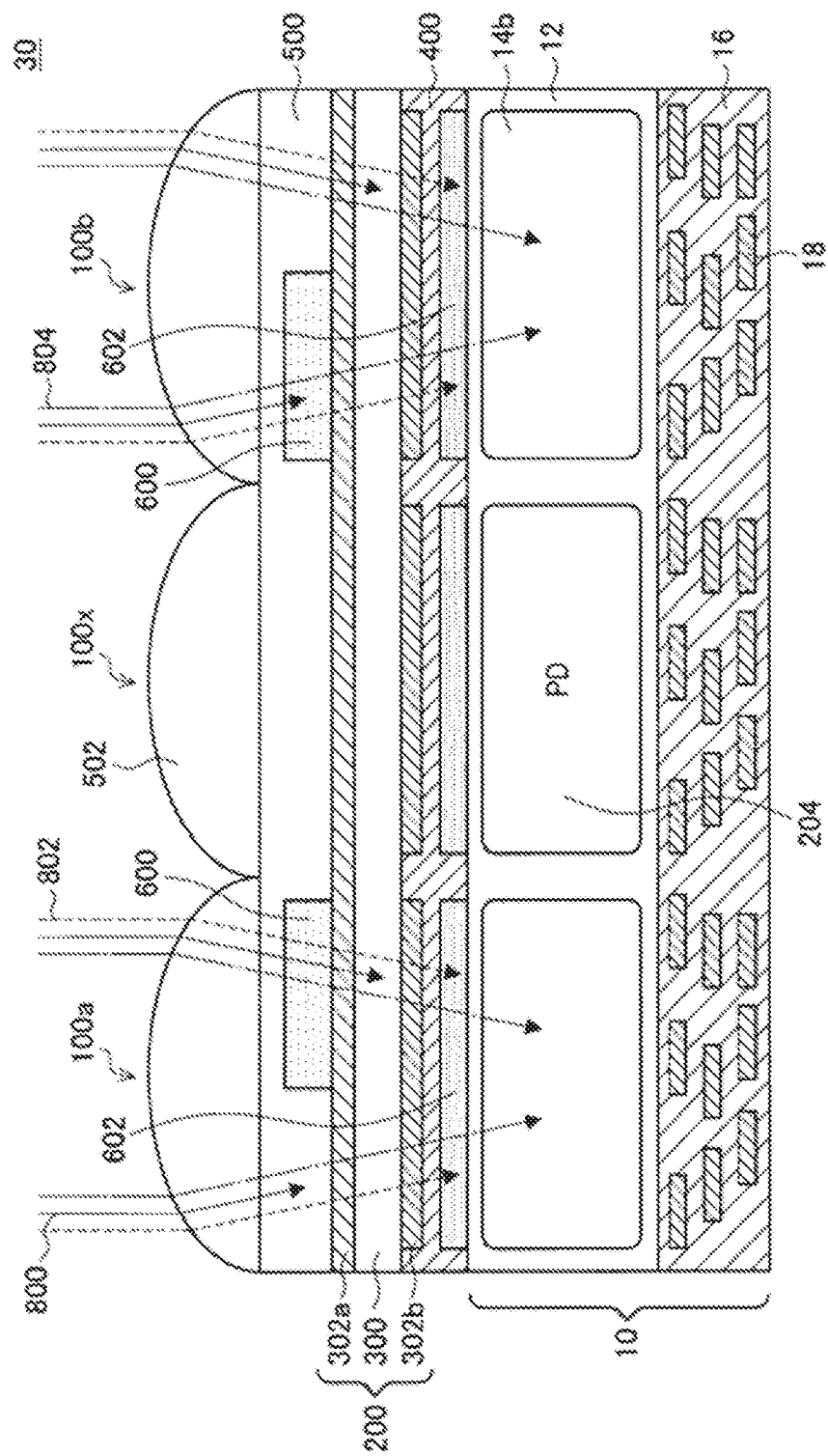
FIG. 16 is an explanatory view illustrating an exemplary sectional configuration of a phase difference detection pixel according to a fifth embodiment of the present disclosure.

According to an embodiment of the present disclosure, as described above, three PDs 200, 202, and 204 that absorb light beams different in wavelength from one another are stacked. However, an embodiment of the present disclosure is not limited to such a stacked structure including three PDs 200, 202, and 204. For example, an embodiment of the present disclosure may employ a stacked structure including two PDs 200 and 204. With reference to FIG. 16, hereinafter, a description will be given of a fifth embodiment of the present disclosure. According to the fifth embodiment, two PDs 200 and 204 are stacked to constitute a stacked structure. FIG. 16 is an explanatory view illustrating exemplary sectional configurations of phase difference detection pixels 100a and 100b according to the present embodiment. Specifically, the exemplary sectional configurations correspond to a section of a phase difference detection pixel 100a, a section of a normal pixel 100x, and a section of a phase difference detection pixel 100b, the pixels being cut along a thickness direction of a semiconductor substrate 10. In FIG. 16, as in FIG. 3, an arrow 800 indicated by a solid line represents an optical path of a green light beam, an arrow 802 indicated by a broken line represents an optical path of a blue light beam, and an arrow 804 indicated by a chain line represents an optical path of a red light beam.

In the present embodiment, as illustrated in FIG. 16, phase difference detection pixels 100a and 100b are almost similar in stacked structure to the foregoing phase difference detection pixels 100a and 100b according to the first embodiment, except that only PDs 204 are provided in a semiconductor substrate 10. The phase difference detection pixels 100a and 100b according to the present embodiment are also different from those according to the first embodiment in that color filters 602 are provided on the semiconductor substrate 10, that is, are provided to entirely cover light receiving surfaces of the PDs 204. In the example illustrated in FIG. 16, each PD 204 is a photodiode that receives and photoelectrically converts a red light beam 804. Each color filter 602 is a color filter (a yellow filter) that absorbs a blue light beam 802, as in the color filters 600a according to the second embodiment. In other words, the color filters 602 absorb light beams different in wavelength from light beams to be absorbed by the PDs 204 located below the color filters 602. In each of the phase difference detection pixels 100a and 100b according to the present embodiment, therefore, a PD 200 functions as a phase difference detection pixel that detects a phase difference based on green light beams 800, and the PDs 204 function as normal pixels that detect red light beams 804.

In the present embodiment, each color filter 602 may be a color filter (a cyan filter) that absorbs a red light beam 804, as in the color filters 600b according to the second embodiment. In this case, a photodiode to be provided in the semiconductor substrate 10 serves as a PD 202 that receives and photoelectrically converts a blue light beam.

As described above, a color filter 602 is provided near a PD 204 in a stacked structure, which improves a segregation ratio in a captured image. It is however preferable that the respective layers in the stacked structure illustrated in FIG. 16 are formed to avoid application of high heat to the color filters 600a nd 602 since heat tends to alter the color filters 600a nd 602.

<<9. Sixth Embodiment>>

Figure 17:
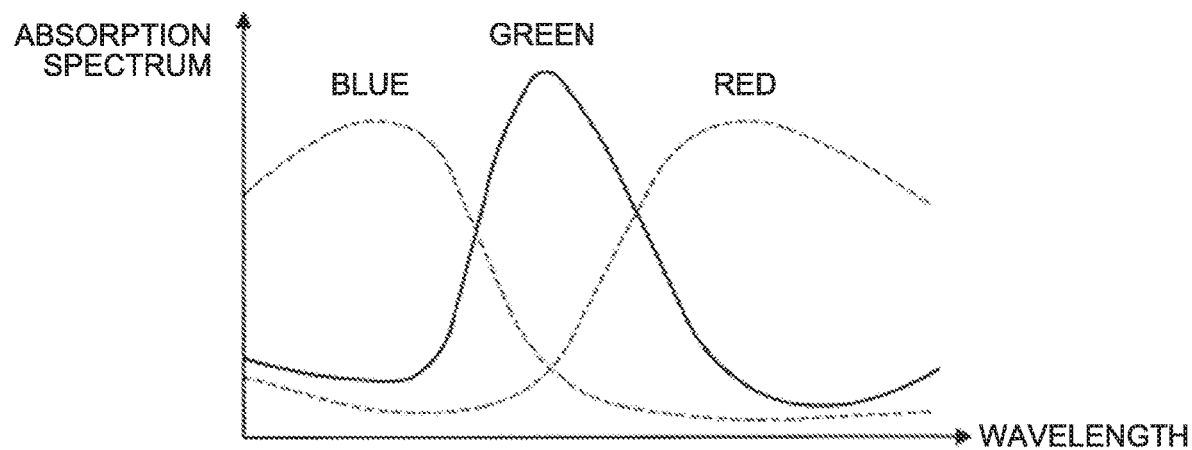
FIG. 17 is an explanatory view (part 1) illustrating a sixth embodiment of the present disclosure.
Figure 18:
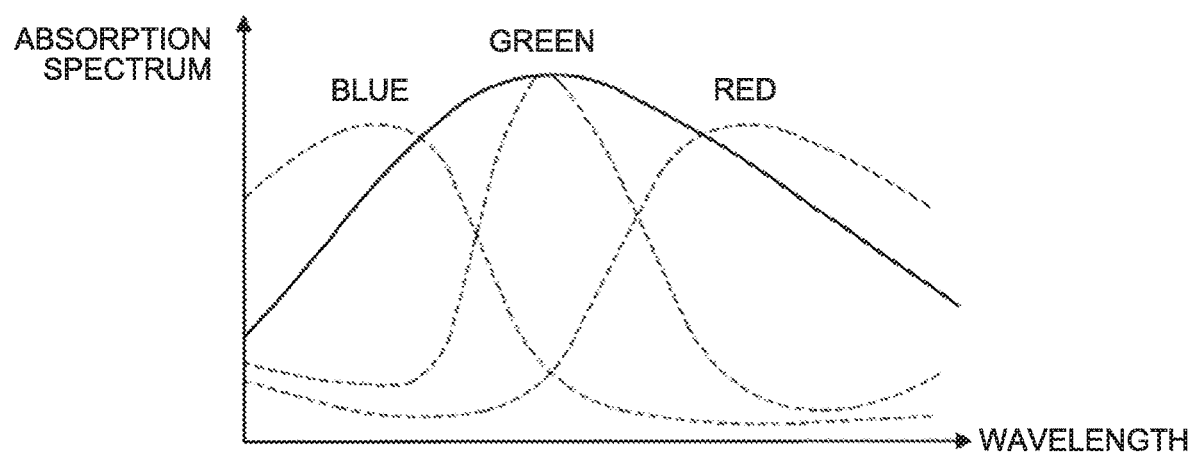
FIG. 18 is an explanatory view (part 2) illustrating the same embodiment.
Figure 19:
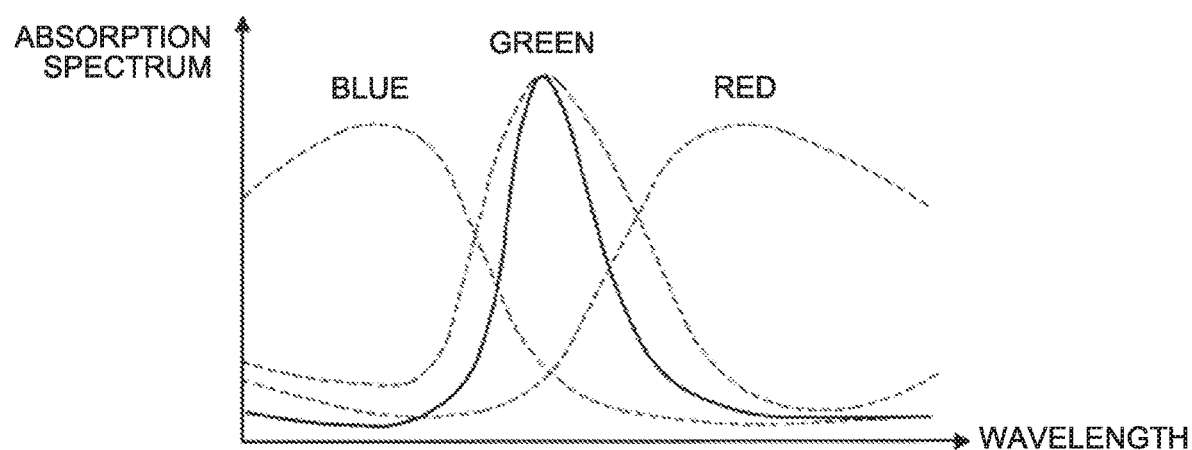
FIG. 19 is an explanatory view (part 3) illustrating the same embodiment.

With reference to FIGS. 17 to 19, hereinafter, a description will be given of an absorption spectrum characteristic of a color filter 600a ccording to an embodiment of the present disclosure, as a sixth embodiment of the present disclosure. FIGS. 17 to 19 are explanatory views each illustrating the present embodiment. Specifically, FIGS. 17 to 19 each illustrate an absorption spectrum characteristic of a color filter 600 that absorbs a green light beam 800, with regard to a wavelength. In each of the figures, a solid line represents an exemplary absorption spectrum characteristic of a color filter 600, and broken lines respectively represent exemplary absorption spectrum characteristics of photodiodes 200, 202, and 204.

Specifically, in a case of phase difference detection pixels 100a and 100b that detect a phase difference based on green light beams 800, as illustrated in FIG. 17, preferably, a wavelength of an absorption peak of a PD 200 that absorbs the green light beams 800 is substantially identical to a wavelength of an absorption peak of color filters 600 that respectively absorb the green light beams 800. Also preferably, an extension of the absorption peak of the PD 200 is substantially identical to an extension of the absorption peak of the color filters 600. This configuration ensures a segregation ratio of the respective colors in a preferable manner. In order to obtain the color filters 600 having the absorption spectrum characteristic illustrated in FIG. 17, each color filter 600 is formed from a resin material containing a dye identical to a dye in the PD 200. That is, each color filter 600 is formed from, for example, a resin material containing a rhodamine dye, a melocyanine dye, a quinacridone derivative, a subphthalocyanine dye (a subphthalocyanine derivative), or the like.

As in the foregoing description, in a case of phase difference detection pixels 100a and 100b that detect a phase difference based on blue light beams 802, preferably, a wavelength of an absorption peak of PDs 202 that respectively absorb the blue light beams 802 is substantially identical to a wavelength of an absorption peak of color filters 600a that respectively absorb the blue light beams 802. Also preferably, an extension of the absorption peak of the PDs 202 is substantially identical to an extension of the absorption peak of the color filters 600a. In this case, each color filter 600a is formed from a resin material containing a dye identical to a dye in each PD 202. That is, each color filter 600a is formed from, for example, a resin material containing a coumaric acid dye, tris-8-hydroxyquinoline aluminum ($Alq_3$), a melocyanine dye, or the like.

As in the foregoing description, in a case of phase difference detection pixels 100a and 100b that detect a phase difference based on red light beams 804, preferably, a wavelength of an absorption peak of PDs 204 that respectively absorb the red light beams 804 is substantially identical to a wavelength of an absorption peak of color filters 600b that respectively absorb the red light beams 804. Also preferably, an extension of the absorption peak of the PDs 204 is substantially identical to an extension of the absorption peak of the color filters 600b. In this case, each color filter 600b is formed from a resin material containing a dye identical to a dye in each PD 204. That is, each color filter 600b is formed from, for example, a resin material containing a phthalocyanine dye, a subphthalocyanine dye (a subphthalocyanine derivative), or the like.

In addition, absorption spectrum characteristics of PDs 202 and 204 in a semiconductor substrate 10 vary depending on degrees of tailing of an absorption peak on a longer wavelength side and a shorter wavelength side as to an absorption spectrum of color filters 600. As illustrated in FIG. 18, for example, in a case where the color filters 600 have a wider absorption peak on a longer wavelength side and a shorter wavelength side, a PD 200 that detects a phase difference based on green light beams 800 is capable of detecting the phase difference with allowance of color deviation from green to a degree. However, since the color filters 600a bsorb blue light beams 802 and red light beams 804 to a degree, color deviation is apt to occur at PDs 202 and 204 that respectively absorb the blue light beams 802 and the red light beams 804. As a result, there is a possibility that the PDs 202 and 204 cannot be used as in PDs 202 and 204 of a normal pixel 100x.

As illustrated in FIG. 19, in contrast, in a case where the color filters 600 have a narrower absorption peak on the longer wavelength side and the shorter wavelength side, the PDs 202 and 204 that absorb the blue light beams 802 and red light beams 804 are capable of suppressing color deviation as in the PDs 202 and 204 of the normal pixel 100x. However, the PD 200 that detects a phase difference based on green light beams 800 has a poor segregation ratio.

That is, in an embodiment of the present disclosure, preferably, a material for a color filter 600 is appropriately selected for achieving both of a preferable segregation ratio of a PD 200 that detects a phase difference and preferable absorption spectrum characteristics of PDs 202 and 204 provided in a semiconductor substrate 10.

<<10. Seventh Embodiment>>

With reference to FIGS. 20 to 23, next, a description will be given of a method for manufacturing the solid-state imaging element 1 according to the first embodiment illustrated in FIG. 3. FIGS. 20 to 23 are sectional views each illustrating the method for manufacturing the solid-state imaging element according to the first embodiment of the present disclosure.

Figure 20:
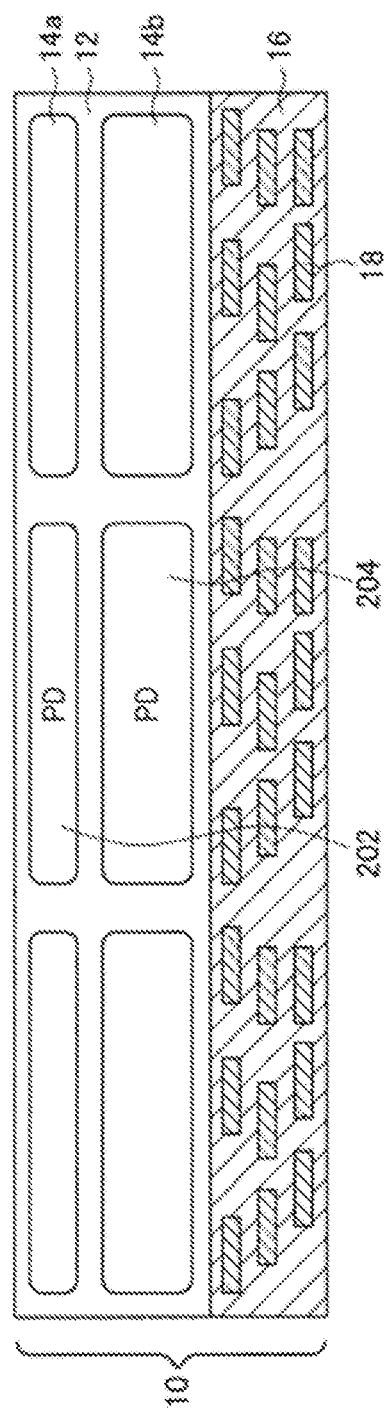
FIG. 20 is a sectional view (part 1) illustrating a method for manufacturing the solid-state imaging element according to the first embodiment of the present disclosure.

As illustrated in FIG. 20, first, PDs 202 and 204 to be stacked, a plug (not illustrated), and the like are formed in a semiconductor region 12 of a semiconductor substrate 10. Furthermore, a wiring layer 16 including a plurality of pixel transistors (not illustrated) that perform read and the like of electrical charges accumulated in the PDs 202 and 204 and a plurality of wires 18 is formed on a lower face of the semiconductor substrate 10.

Next, a laminated layer including a hafnium oxide film and a silicon oxide film each having a predetermined thickness is formed on an upper face of the semiconductor substrate 10. In addition, a plug may be formed to penetrate through the laminated layer in such a manner that an opening (not illustrated) is formed in the laminated layer by lithography, and the opening thus formed is filled with a metal material such as tungsten, aluminum, or copper.

In addition, an upper face of the laminated layer is planarized by chemical mechanical polishing (CMP). For example, an ITO film is formed on the upper face, and is subjected to patterning. Lower electrodes 302*b* are thus formed.

Then, a silicon oxide film and the like are laminated on the lower electrodes 302*b* and the laminated layer. The newly laminated film is subjected to, for example, CMP so as to have a thickness equal to the thickness of the lower electrodes 302*b*. As a result, a transparent insulating film 400 is formed.

Figure 21:
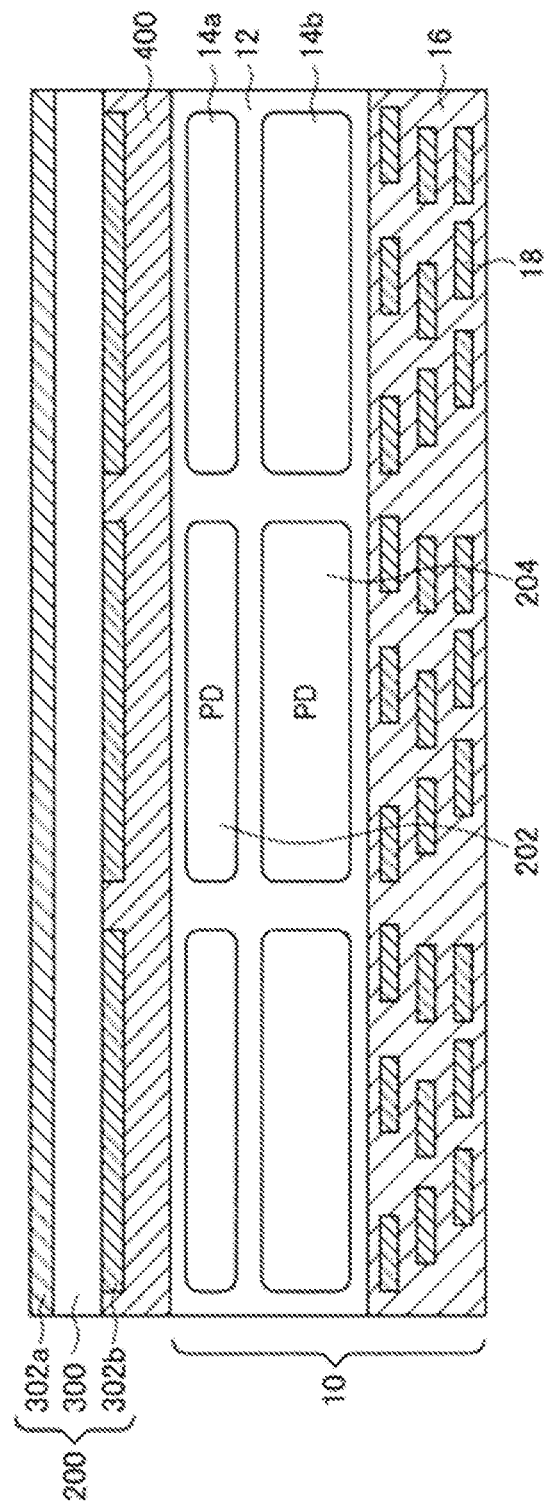
FIG. 21 is a sectional view (part 2) illustrating the method for manufacturing the solid-state imaging element according to the first embodiment of the present disclosure.

Furthermore, a photoelectric conversion film 300 for photoelectrically converting a light beam in a green wavelength range is formed on the transparent insulating film 400. Thereafter, for example, an ITO film is formed on the photoelectric conversion film 300. An upper electrode 302*a* is thus formed. A sectional configuration illustrated in FIG. 21 is thus formed.

Figure 22:
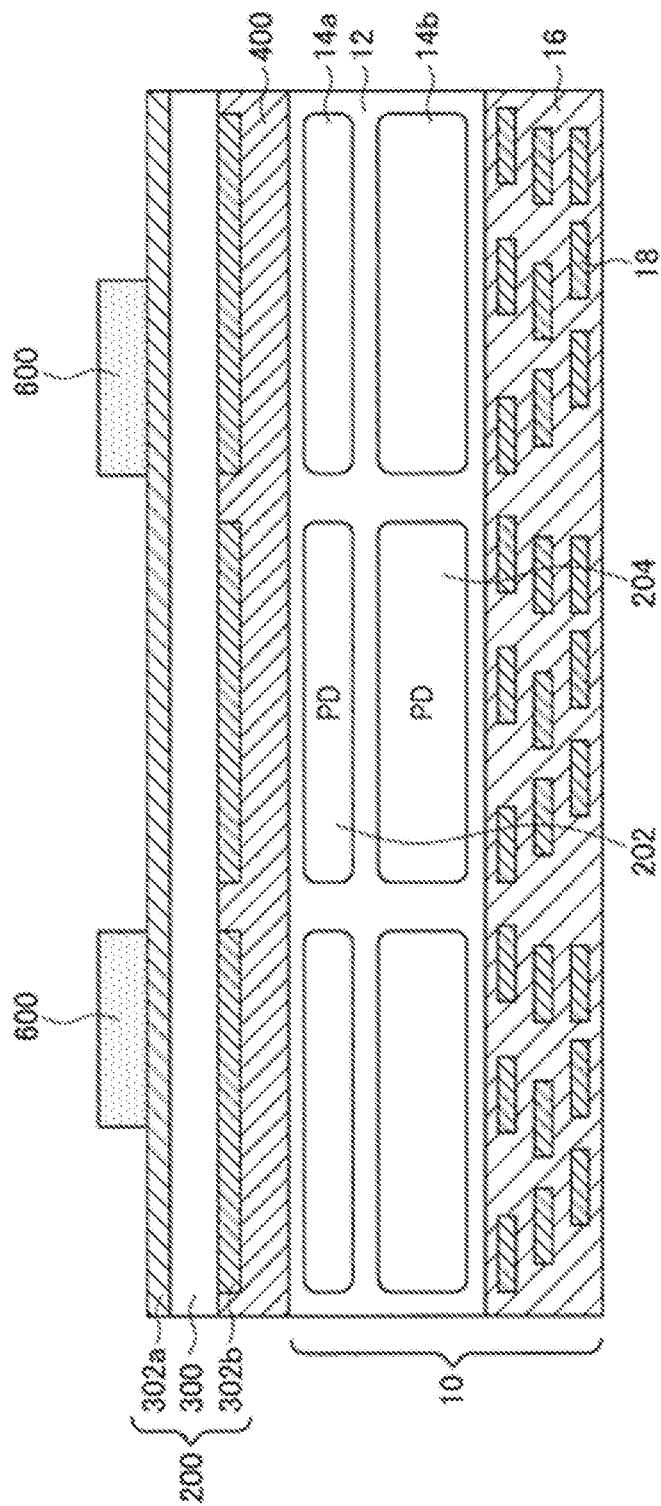
FIG. 22 is a sectional view (part 3) illustrating the method for manufacturing the solid-state imaging element according to the first embodiment of the present disclosure.

Next, as illustrated in FIG. 22, a colored resin material that absorbs a light beam in a green wavelength range and contains, for example, a rhodamine dye or the like is formed by spin coating or vapor deposition in a predetermined region on the upper electrode 302*a*. Color filters 600*a* re thus formed. In addition, each color filter 600 is subjected to exposure or dry etching, and is thus processed into a desired shape. It should be noted that the color filters 600*a* re not necessarily formed and processed by spin coating, exposure, and the like, but may be formed and processed by any method such as a printing method.

Furthermore, a nitride film and the like are formed on the upper electrode 302*a* and the color filters 600. A high refractive index layer 500 is thus formed.

Figure 23:
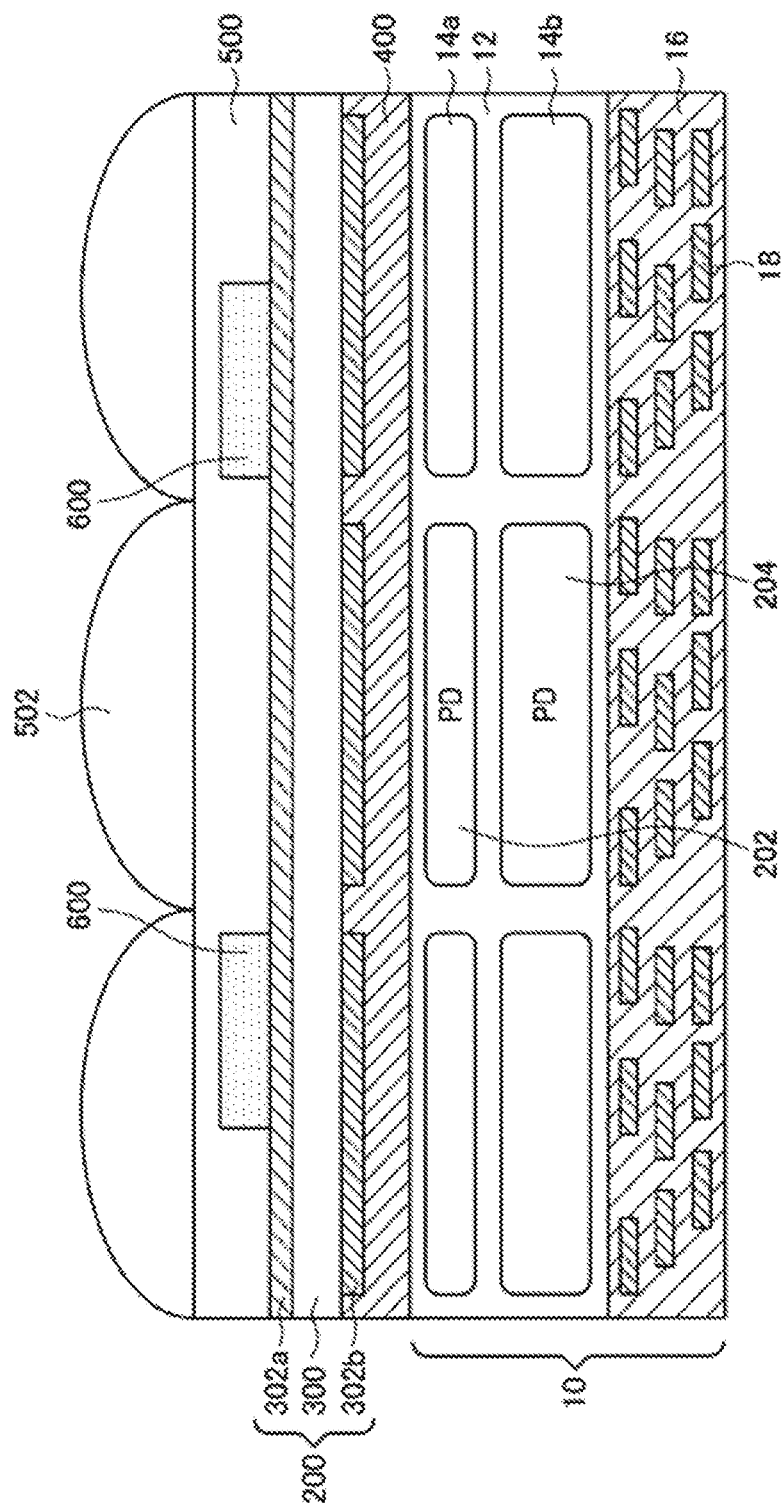
FIG. 23 is a sectional view (part 4) illustrating the method for manufacturing the solid-state imaging element according to the first embodiment of the present disclosure.

Next, a resin material is formed on the high refractive index layer 500, and is subjected to etching. A solid-state imaging element 1 according to the first embodiment can thus be obtained as illustrated in FIG. 23. It should be noted that the manufacturing method according to the present embodiment is not necessarily carried out in the described order, and the order may be appropriately changed. Furthermore, the manufacturing method according to the present embodiment may include other steps. The manufacturing method according to the present embodiment has only to include at least stacking a plurality of PDs 200, 202, and 204 that respectively absorb light beams different in wavelength from one another to generate electrical charges, and forming a color filter 600 or 602 that partially covers an upper face of one of the foregoing PDs 200, 202, and 204 and absorbs a light beam with a specific wavelength.

It should be noted that examples of the method of forming the foregoing respective layers may include a physical vapor deposition (PVD) method and a chemical vapor deposition (CVD) method. Examples of the PVD method may include a vacuum vapor deposition method, an electron beam (EB) vapor deposition method, various sputtering methods (a magnetron sputtering method, an RF-DC coupled bias sputtering method, an electron cyclotron resonance (ECR) sputtering method, a counter target sputtering method, a high-frequency sputtering method, and the like), an ion plating method, a laser ablation method, a molecular beam epitaxy method (an MBE method), and a laser transfer method. Moreover, examples of the CVD method may include a plasma CVD method, a thermal CVD method, a metal organic (MO) CVD method, and a photo CVD method. Furthermore, examples of the other methods may include an electroplating method, an electroless plating method, a spin coating method, an inkjet method, a spray coating method, a stamping method, a microcontact printing method, a flexographic printing method, an offset printing method, a gravure printing method, a dipping method, and the like. Furthermore, examples of the method of patterning the respective layers may include chemical etching such as shadow mask, laser transfer, and photolithography, and physical etching using ultraviolet rays, laser, and the like. Moreover, examples of the CVD method may include a plasma CVD method, a thermal CVD method, an MOCVD method, and a photo CVD method. Examples of still other methods may include a spin coating method; a dipping method; a casting method; a microcontact printing method; a drop casting method; various printing methods such as a screen printing method, an inkjet printing method, an offset printing method, a gravure printing method, and a flexographic printing method; a stamping method; a spray method; and various coating methods such as an air doctor coater method, a blade coater method, a rod coater method, a knife coater method, a squeeze coater method, a reverse roll coater method, a transfer roll coater method, a gravure coater method, a kiss coater method, a cast coater method, a spray coater method, a slit orifice coater method, and a calender coater method. Furthermore, examples of the patterning method may include chemical etching such as shadow mask, laser transfer, and photolithography, and physical etching using ultraviolet rays, laser, and the like. In addition, examples of the planarization technique may include a CMP method, a laser planarization method, a reflow method, and the like.

<<11. Eighth Embodiment>>

Figure 24:
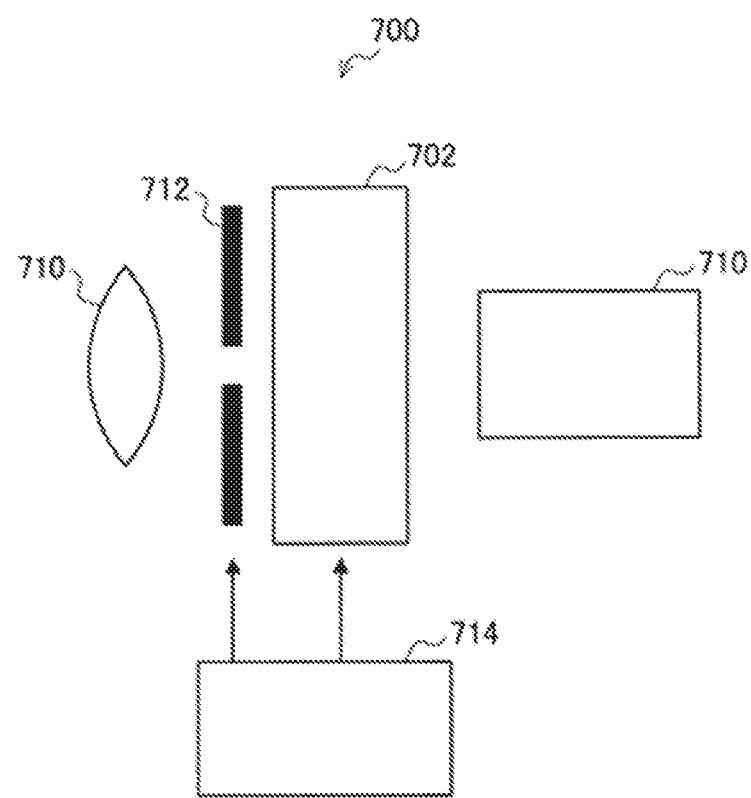
FIG. 24 is an explanatory view illustrating an exemplary electronic apparatus including an imaging device including a solid-state imaging element according to an embodiment of the present disclosure.

The foregoing solid-state imaging element 1 according to an embodiment of the present disclosure is applicable to all electronic apparatuses including a solid-state imaging element as an image capturing unit. Examples of the electronic apparatuses may include imaging devices such as a digital still camera and a video camera, potable terminal devices having an imaging function, and copiers including a solid-state imaging element as an image scanning unit. An embodiment of the present disclosure is also applicable to a robot, a drone, an automobile, a medical apparatus (an endoscope), and the like each including the foregoing imaging device. It should be noted that a solid-state imaging element 1 according to the present embodiment may take a form of one chip or may take a form of a module into which an imaging unit and a signal processing unit or an optical system are packaged, the module having an imaging function. With reference to FIG. 24, hereinafter, a description will be given of an exemplary electronic apparatus 700 including an imaging device 702 including the solid-state imaging element 1 according to the present embodiment, as a seventh embodiment. FIG. 24 is an explanatory view illustrating an exemplary electronic apparatus 700 including an imaging device 702 including a solid-state imaging element 1 according to an embodiment of the present disclosure.

As illustrated in FIG. 24, an electronic apparatus 700 includes an imaging device 702, an optical lens 710, a shutter mechanism 712, a drive circuit unit 714, and a signal processing circuit unit 716. The optical lens 710 forms an image of image light (incident light) from a subject onto an imaging surface of the imaging device 702. Signal electrical charges are thus accumulated in the solid-state imaging element 1 of the imaging device 702 for a certain period of time. The shutter mechanism 712 is opened and closed to control a period in which the imaging device 702 is irradiated with light and a period in which the imaging device 702 is shielded from light. The drive circuit unit 714 supplies to the imaging device 702 a driving signal for controlling a signal transfer operation by the imaging device 702, and supplies to the shutter mechanism 712 a driving signal for controlling a shutter operation by the shutter mechanism 712. That is, the imaging device 702 performs signal transfer based on a driving signal (a timing signal) supplied from the drive circuit unit 714. The signal processing circuit unit 716 performs various kinds of signal processing. For example, the signal processing circuit unit 716 outputs a video signal subjected to signal processing to a storage medium (not illustrated) such as a memory or to a display (not illustrated).

<<12. Conclusion>>

As described above, according to an embodiment of the present disclosure, it is possible to actualize phase difference detection pixels 100a and 100b that enable a finer pattern of pixels and also enable improvement in quality of a captured image in a stacked structure including a plurality of photodiodes.

In the foregoing embodiments of the present disclosure, the solid-state imaging elements have been described with a first conduction type defined as a P type, a second conduction type defined as an N type, and electrons used as signal electrical charges. However, an embodiment of the present disclosure is not limited to such examples. For example, the present embodiment may employ a solid-state imaging element with a first conduction type defined as an N type, a second conduction type defined as a P type, and holes used as signal electrical charges.

Also in the foregoing embodiments of the present disclosure, the semiconductor substrates 10 are not necessarily a silicon substrate, but may be other substrates (e.g., a silicon-on-insulator (SOI) substrate, an SiGe substrate, and the like). Alternatively, the semiconductor substrates 10 may be such various substrates on which a semiconductor structure and the like are formed.

In addition, a solid-state imaging element according to an embodiment of the present disclosure is not limited to a solid-state imaging element configured to sense distribution of quantities of incident light as visible light and to capture an image of the distribution. For example, the present embodiment is applicable to a solid-state imaging element configured to capture an image of distribution of quantities of incident infrared rays, X rays, particles, or the like, or a solid-state imaging element (a physical quantity distribution sensing device) such as a fingerprint detection sensor configured to sense distribution of other physical quantities, such as pressure or capacitance, and to capture an image of the distribution.

<<13. Supplement>>

Preferred embodiments of the present disclosure have been described in detail with reference to the accompanying drawings; however, the technical scope of the present disclosure is not limited to such examples. It is evident that a person having ordinary knowledge in the technical field of the present disclosure is able to conceive various changes or modifications within the scope of the technical idea as defined in the appended claims, and it is to be understood that such changes or modifications may also fall within the technical scope of the present disclosure.

In addition, the advantageous effects described in the present specification are merely descriptive or illustrative but not limitative. That is, the technology related to the present disclosure may produce other advantageous effects apparent to those skilled in the art from the description of the present specification, in addition to the foregoing advantageous effects or in place of the foregoing advantageous effects.

It should be noted that the following configurations also fall within the technical scope of the present disclosure.

(1)

A solid-state imaging element comprising:

a plurality of pixels including at least two phase difference detection pixels for focus detection, wherein each pixel has a stacked structure including a plurality of photoelectric conversion elements that are stacked on top of each other and absorb light beams different in wavelength from one another to generate electrical charges, and each phase difference detection pixel includes, in the stacked structure, a color filter that partially covers an upper face of one of the photoelectric conversion elements and absorbs a light beam with a specific wavelength.

(2)

The solid-state imaging element according to (1), wherein in each stacked structure, the color filter covers half of an upper face of one of the photoelectric conversion elements.

(3)

The solid-state imaging element according to (1) or (2), wherein each color filter has a rectangular shape or a triangular shape when the stacked structure is seen from above.

(4)

The solid-state imaging element according to any one of (1) to (3), wherein each phase difference detection pixel further includes a lens part disposed above the stacked structure, and a position of a center point of each color filter is different from a position of an optical axis of the corresponding lens part.

(5)

The solid-state imaging element according to any one of (1) to (4), wherein in the at least two phase difference detection pixels, positions of the color filters in the phase difference detection pixels are different from each other when the stacked structures are seen from above.

(6)

The solid-state imaging element according to any one of (1) to (4), comprising a plurality of the phase difference detection pixels including the color filters that absorb light beams different in wavelength from one another.

(7)

The solid-state imaging element according to any one of (1) to (4), wherein a most absorbed light beam by each color filter is substantially identical in wavelength to a most absorbed light beam by a light absorption material contained in one of the photoelectric conversion elements.

(8)

The solid-state imaging element according to any one of (1) to (4), wherein each color filter contains a component that is identical to a component of a light absorption material contained in one of the photoelectric conversion elements.

(9)

The solid-state imaging element according to any one of (1) to (8), wherein at least one of the photoelectric conversion elements includes an organic photoelectric conversion film.

(10)

The solid-state imaging element according to (1), wherein each stacked structure includes a first photoelectric conversion element, a second photoelectric conversion element stacked below the first photoelectric conversion element, and a third photoelectric conversion element stacked below the second photoelectric conversion element, and in each stacked structure, the color filter partially covers an upper face of the first photoelectric conversion element.

(11)

The solid-state imaging element according to (10), wherein each color filter absorbs a light beam with a wavelength that is equal to a wavelength of a light beam to be absorbed by the corresponding first photoelectric conversion element.

(12)

The solid-state imaging element according to (10), wherein each color filter absorbs a light beam with a wavelength that is equal to a wavelength of a light beam to be absorbed by the corresponding second photoelectric conversion element.

(13)

The solid-state imaging element according to (10), wherein each color filter absorbs a light beam with a wavelength that is equal to a wavelength of a light beam to be absorbed by the corresponding third photoelectric conversion element.

(14)

The solid-state imaging element according to (11), wherein each first photoelectric conversion element includes an upper electrode, lower electrodes divided for the respective pixels, and a photoelectric conversion film sandwiched between the upper electrode and the lower electrodes, each lower electrode is divided into at least two, and a divided one of the lower electrodes is an electrical charge accumulating electrode that faces the photoelectric conversion film across an insulating film and attracts an electrical charge generated at the photoelectric conversion film.

(15)

The solid-state imaging element according to (1), wherein each stacked structure includes a first photoelectric conversion element, a second photoelectric conversion element stacked below the first photoelectric conversion element, and a third photoelectric conversion element stacked below the second photoelectric conversion element, and in each stacked structure, the color filter partially covers an upper face of the second photoelectric conversion element.

(16)

The solid-state imaging element according to (1), wherein each stacked structure includes a first photoelectric conversion element and a second photoelectric conversion element stacked below the first photoelectric conversion element, in each stacked structure, the color filter partially covers an upper face of the first photoelectric conversion element, and each phase difference detection pixel further includes, in the stacked structure, another color filter that covers an upper face of the second photoelectric conversion element.

(17)

A method for manufacturing a solid-state imaging element including a plurality of pixels including at least two phase difference detection pixels for focus detection, the method comprising:

stacking a plurality of photoelectric conversion elements that absorb light beams different in wavelength from one another to generate electrical charges; and forming a color filter that partially covers an upper face of one of the photoelectric conversion elements and absorbs a light beam with a specific wavelength.

(18)

An electronic apparatus comprising:

a solid-state imaging element including a plurality of pixels including at least two phase difference detection pixels for focus detection, wherein each pixel has a stacked structure including a plurality of photoelectric conversion elements that are stacked on top of each other and absorb light beams different in wavelength from one another to generate electrical charges, and each phase difference detection pixel includes, in the stacked structure, a color filter that partially covers an upper face of one of the photoelectric conversion elements and absorbs a light beam with a specific wavelength.

REFERENCE SIGNS LIST

1 SOLID-STATE IMAGING ELEMENT
10 SEMICONDUCTOR SUBSTRATE
12, 14a, 14b SEMICONDUCTOR REGION
16 WIRING LAYER
18 WIRE
30 PIXEL ARRAY PART
32 VERTICAL DRIVE CIRCUIT
34 COLUMN SIGNAL PROCESSING CIRCUIT
36 HORIZONTAL DRIVE CIRCUIT
38 OUTPUT CIRCUIT
40 CONTROL CIRCUIT
42 PIXEL DRIVE WIRE
44 VERTICAL SIGNAL LINE
46 HORIZONTAL SIGNAL LINE
48 INPUT AND OUTPUT TERMINAL
100, 100a, 100b, 100x PIXEL
200, 202, 204 PD
300 PHOTOELECTRIC CONVERSION FILM
302a, 302b ELECTRODE
304 INSULATING FILM
400 TRANSPARENT INSULATING FILM
500 HIGH REFRACTIVE INDEX LAYER
502 ON-CHIP LENS
504 OPTICAL AXIS 600, 600a, 600b, 602 COLOR FILTER
604 CENTER POINT
700 ELECTRONIC APPARATUS
702 IMAGING DEVICE
710 OPTICAL LENS
712 SHUTTER MECHANISM
714 DRIVE CIRCUIT UNIT
716 SIGNAL PROCESSING CIRCUIT UNIT
800, 802, 804 LIGHT BEAM

The invention claimed is:

1. A solid-state imaging element, comprising:
a plurality of pixels including a set of phase difference detection pixels for focus detection, wherein each pixel of the plurality of pixels includes:
an upper electrode;
a stacked structure including a plurality of photoelectric conversion elements, wherein the plurality of photoelectric conversion elements includes:
a first photoelectric conversion element configured to:
absorb a first light beam of a first wavelength; and
generate electrical charges based on the absorption of the first light beam; and
a second photoelectric conversion element configured to:
absorb a second light beam of a second wavelength different from the first wavelength; and
generate electrical charges based on the absorption of the second light beam, and
the set of phase difference detection pixels includes:
a first phase difference detection pixel that includes a first color filter on the upper electrode in the first phase difference detection pixel, wherein
the first color filter is different from each of the first photoelectric conversion element and the second photoelectric conversion element in the first phase difference detection pixel,
the first color filter is configured to absorb a third light beam of a third wavelength, and
the first color filter covers a right half of an upper face of one of the first photoelectric conversion element or the second photoelectric conversion element of the first phase difference detection pixel; and
a second phase difference detection pixel that includes a second color filter on the upper electrode in the second phase difference detection pixel, wherein
the second color filter is different from each of the first photoelectric conversion element and the second photoelectric conversion element in the second phase difference detection pixel,
the second color filter is configured to absorb a fourth light beam of a fourth wavelength different from the third wavelength,
the second color filter covers a left half of an upper face of one of the first photoelectric conversion element or the second photoelectric conversion element of the second phase difference detection pixel,
a position of the second color filter in the second phase difference detection pixel is different from a position of the first color filter in the first phase difference detection pixel, and
the first color filter and the second color filter are absent on a left half of the upper face of the one of the first photoelectric conversion element or the second photoelectric conversion element of the first phase difference detection pixel.

2. The solid-state imaging element according to claim 1, wherein
the first color filter covers the right half of the upper face of the first photoelectric conversion element of the first phase difference detection pixel, and
the second color filter covers the left half of the upper face of the first photoelectric conversion element of the second phase difference detection pixel.

3. The solid-state imaging element according to claim 1, wherein each of the first color filter and the second color filter has one of a rectangular shape or a triangular shape.

4. The solid-state imaging element according to claim 1, wherein
each phase difference detection pixel of the set of phase difference detection pixels further includes a lens part on the stacked structure, and
a position of a center point of the first color filter is different from a position of an optical axis of the lens part in the first phase difference detection pixel.

5. The solid-state imaging element according to claim 1, wherein
each photoelectric conversion element of the plurality of photoelectric conversion elements includes a light absorption material,
the light absorption material in one photoelectric conversion element of the plurality of photoelectric conversion elements is configured to absorb a fifth light beam of a fifth wavelength, and
the third wavelength of the third light beam absorbed by the first color filter is substantially identical to the fifth wavelength of the fifth light beam absorbed by the light absorption material in the one photoelectric conversion element of the first phase difference detection pixel.

6. The solid-state imaging element according to claim 1, wherein
the first color filter includes a first component identical to a second component of a light absorption material in one photoelectric conversion element of the plurality of photoelectric conversion elements of the first phase difference detection pixel.

7. The solid-state imaging element according to claim 1, wherein at least one photoelectric conversion element of the plurality of photoelectric conversion elements includes an organic photoelectric conversion film.

8. The solid-state imaging element according to claim 1, wherein
the second photoelectric conversion element is below the first photoelectric conversion element,
the stacked structure further includes a third photoelectric conversion element, of the plurality of photoelectric conversion elements, below the second photoelectric conversion element, and
the first color filter covers the right half of the upper face of the first photoelectric conversion element of the first phase difference detection pixel.

9. The solid-state imaging element according to claim 8, wherein
the third wavelength of the third light beam absorbed by the first color filter is equal to the first wavelength of the first light beam absorbed by the first photoelectric conversion element of the first phase difference detection pixel.

10. The solid-state imaging element according to claim 8, wherein the third wavelength of the third light beam absorbed by the first color filter is equal to the second wavelength of the second light beam absorbed by the second photoelectric conversion element of the first phase difference detection pixel.

11. The solid-state imaging element according to claim 8, wherein
the third photoelectric conversion element is configured to absorb a fifth light beam of a fifth wavelength, and
the third wavelength of the third light beam absorbed by the first color filter is equal to the fifth wavelength of the fifth light beam absorbed by the third photoelectric conversion element of the first phase difference detection pixel.

12. The solid-state imaging element according to claim 9, wherein the first photoelectric conversion element includes:
a lower electrode divided into a first lower electrode and a second lower electrode; and
a photoelectric conversion film between the upper electrode and the lower electrode, wherein
the photoelectric conversion film is configured to generate an electric charge,
the first lower electrode is an electrical charge accumulating electrode that faces the photoelectric conversion film across an insulating film, and
the first lower electrode is configured to attract the electrical charge generated at the photoelectric conversion film.

13. The solid-state imaging element according to claim 1, wherein
each pixel of the plurality of pixels further comprises a refractive index layer above the first photoelectric conversion element, and
the first color filter and the second color filter are in the refractive index layer.

14. A method for manufacturing a solid-state imaging element, the method comprising:
stacking a plurality of photoelectric conversion elements for each pixel of a plurality of pixels of the solid-state imaging element, wherein
the plurality of pixels includes a set of phase difference detection pixels for focus detection,
each pixel of the plurality of pixels includes an upper electrode,
the plurality of photoelectric conversion elements includes:
a first photoelectric conversion element configured to:
absorb a first light beam of a first wavelength; and
generate electrical charges based on the absorption of the first light beam; and
a second photoelectric conversion element configured to:
absorb a second light beam of a second wavelength different from the first wavelength; and
generate electrical charges based on the absorption of the second light beam;
forming a first color filter on the upper electrode in a first phase difference detection pixel of the set of phase difference detection pixels, wherein
the first color filter covers a right half of an upper face of one of the first photoelectric conversion element or the second photoelectric conversion element of the first phase difference detection pixel,
the first color filter is different from each of the first photoelectric conversion element and the second photoelectric conversion element in the first phase difference detection pixel, and
the first color filter is configured to absorb a third light beam of a third wavelength; and
forming a second color filter on the upper electrode in a second phase difference detection pixel of the set of phase difference detection pixels, wherein
the second color filter covers a left half of an upper face of one of the first photoelectric conversion element or the second photoelectric conversion element of the second phase difference detection pixel,
the second color filter is different from each of the first photoelectric conversion element and the second photoelectric conversion element in the second phase difference detection pixel,
the second color filter is configured to absorb a fourth light beam of a fourth wavelength different from the third wavelength,
a position of the second color filter in the second phase difference detection pixel is different from a position of the first color filter in the first phase difference detection pixel, and
the first color filter and the second color filter are absent on a left half of the upper face of the one of the first photoelectric conversion element or the second photoelectric conversion element of the first phase difference detection pixel.

15. An electronic apparatus, comprising:
a solid-state imaging element including a plurality of pixels including a set of phase difference detection pixels for focus detection, wherein
each pixel of the plurality of pixels includes:
an upper electrode;
a stacked structure including a plurality of photoelectric conversion elements, wherein the plurality of photoelectric conversion elements includes:
a first photoelectric conversion element configured to:
absorb a first light beam of a first wavelength; and
generate electrical charges based on the absorption of the first light beam; and
a second photoelectric conversion element configured to:
absorb a second light beam of a second wavelength different from the first wavelength; and
generate electrical charges based on the absorption of the second light beam, and
the set of phase difference detection pixels includes:
a first phase difference detection pixel that includes a first color filter on the upper electrode in the first phase difference detection pixel, wherein
the first color filter is different from each of the first photoelectric conversion element and the second photoelectric conversion element in the first phase difference detection pixel,
the first color filter is configured to absorb a third light beam of a third wavelength, and
the first color filter covers a right half of an upper face of one of the first photoelectric conversion element or the second photoelectric conversion element of the first phase difference detection pixel; and
a second phase difference detection pixel that includes a second color filter on the upper electrode in the second phase difference detection pixel, wherein the second color filter is different from each of the first photoelectric conversion element and the second photoelectric conversion element in the second phase difference detection pixel, the second color filter is configured to absorb a fourth light beam of a fourth wavelength different from the third wavelength, the second color filter covers a left half of an upper face of one of the first photoelectric conversion element or the second photoelectric conversion element of the second phase difference detection pixel, a position of the second color filter in the second phase difference detection pixel is different from a position of the first color filter in the first phase difference detection pixel, and the first color filter and the second color filter are absent on a left half of the upper face of the one of the first photoelectric conversion element or the second photoelectric conversion element of the first phase difference detection pixel.

\* \* \* \* \*